US012655538B2

(12) United States Patent

Karunadasa et al.

(10) Patent No.: US 12,655,538 B2

(45) Date of Patent: Jun. 16, 2026

(54) DIRECTED ASSEMBLY OF LAYERED HETEROSTRUCTURES AS SINGLE CRYSTALS

(71) Applicant: The Board of Trustees of the Leland Stanford Junior University, Stanford, CA (US)

(72) Inventors: Hemamala Indivari Karunadasa, Palo Alto, CA (US); Abraham Saldivar, Stanford, CA (US); Michael Aubrey, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 18/569,351

(22) PCT Filed: Jun. 15, 2022

(86) PCT No.: PCT/US2022/033655

§ 371 (c)(1),
(2) Date: Dec. 12, 2023

(87) PCT Pub. No.: WO2022/266238

PCT Pub. Date: Dec. 22, 2022

(65) Prior Publication Data

US 2024/0271324 A1 Aug. 15, 2024

Related U.S. Application Data

(60) Provisional application No. 63/210,737, filed on Jun. 15, 2021.

(51) Int. Cl.
*C30B 29/68* (2006.01)
*C30B 7/14* (2006.01)
(Continued)

(52) U.S. Cl.
CPC ............... *C30B 29/68* (2013.01); *C30B 7/14* (2013.01); *C30B 29/54* (2013.01); *H10F 71/00* (2025.01); *H10F 77/12* (2025.01); *H10F 77/30* (2025.01)

(58) Field of Classification Search
CPC ........... C30B 29/68; C30B 29/54; C30B 7/14; H10F 71/00; H10F 77/12; H10F 77/30
See application file for complete search history.

(56) References Cited

U.S. PATENT DOCUMENTS 6,429,318 B1 8/2002 Mitzi
2016/0076152 A1 3/2016 Will-Cole
(Continued)

OTHER PUBLICATIONS

Li (Year: 2019).*

(Continued)

*Primary Examiner* — Sadie White

(74) *Attorney, Agent, or Firm* — Kaplan Breyer Schwarz, LLP

(57) ABSTRACT

Layered or 2D halide perovskites form in solution through the templating effects of organoammnonium groups. The use of organic groups with two different functionalities allows for the formation of a perovskite/non-perovskite hetero-structure in aqueous or organic solution. A first functional group templates the perovskite and a second functional group templates a new 2D or ID inorganic non-perovskite lattice between the perovskite sheets. The perovskite and the intergrowth may be separated from each other by organic molecules, or they may be in contact with each other (e.g., by sharing an atom).

15 Claims, 35 Drawing Sheets

(51) Int. Cl.

| | | |
|---|---|---|
| *C30B 29/54* | (2006.01) | |
| *H10F 71/00* | (2025.01) | |
| *H10F 77/12* | (2025.01) | |
| *H10F 77/30* | (2025.01) | |

(56) References Cited

U.S. PATENT DOCUMENTS

| | | | |
|---|---|---|---|
| 2016/0289554 A1* | 10/2016 | Dohner | C09K 11/06 |
| 2017/0194101 A1 | 7/2017 | Karunadasa et al. | |
| 2020/0090876 A1* | 3/2020 | Zhu | H01G 9/0036 |

OTHER PUBLICATIONS

Jung (Year: 2019).*
Mao (Year: 2017).*
Mercier (Year: 2004).*
Dohner Supplemental (Year: 2014).*
Dohner (Year: 2014).*
Krishnamurthy Supplemental (Year: 2018).*
Krishnamurthy (Year: 2018).*
Mao (Year: 2016).*
Febriansyah (Year: 2020).*
Cao (Year: 2018).*
Zhang Supplemental (Year: 2017).*
Zhang (Year: 2017).*
Authorized Officer: Kari Rodriquez, International Search Report and Written Opinion issued in PCT Application No. PCT/US2022/033655, Oct. 3, 2022, 10 pp.
Bayrammurad Saparov et al., "Organic-Inorganic Perovskites: Structural Versatility for Functional Materials Design", "Chemical Review", Apr. 4, 2016, pp. 4558-4596, 116, 7, https://doi.org/10.1021/acs.chemrev.5b00715.

* cited by examiner

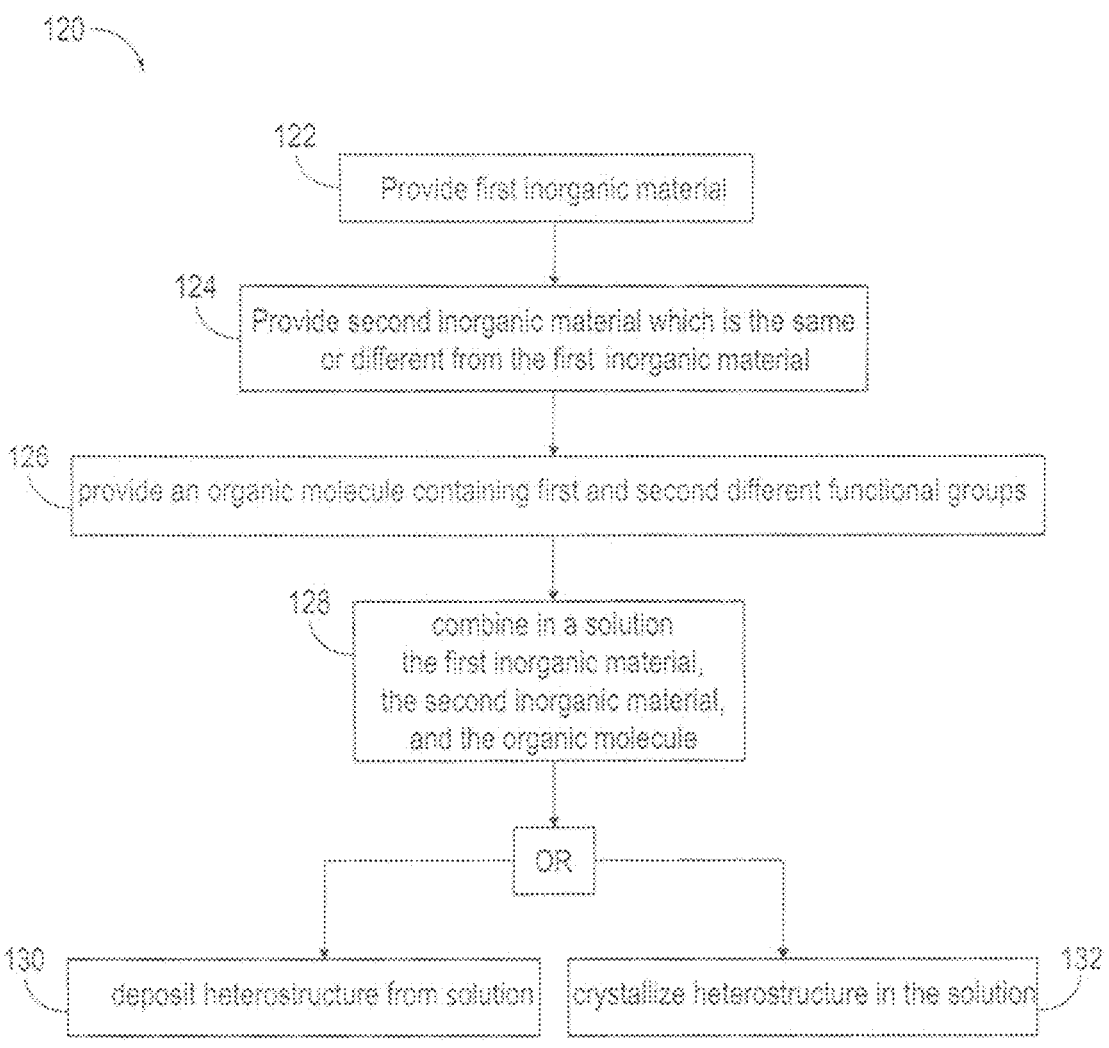

120

122 — Provide first inorganic material

124 — Provide second inorganic material which is the same or different from the first inorganic material 126 — provide an organic molecule containing first and second different functional groups 128 — combine in a solution
the first inorganic material,
the second inorganic material,
and the organic molecule

OR

130 — deposit heterostructure from solution     crystalize heterostructure in the solution — 132

FIG. 1B

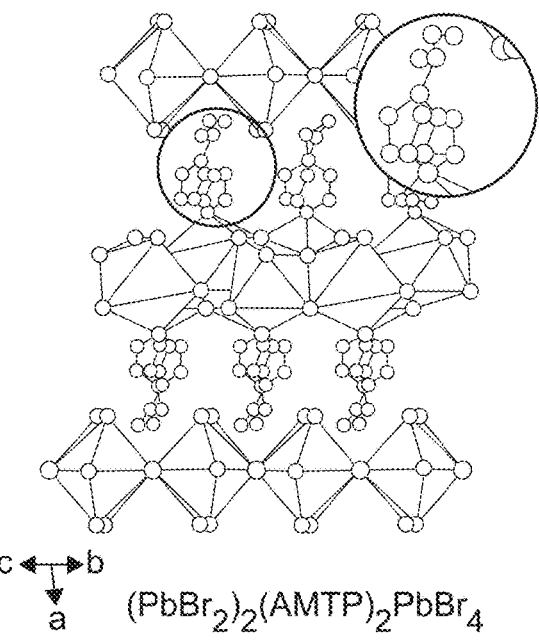
$(PbBr_2)_2(AMTP)_2PbBr_4$
FIG. 3A
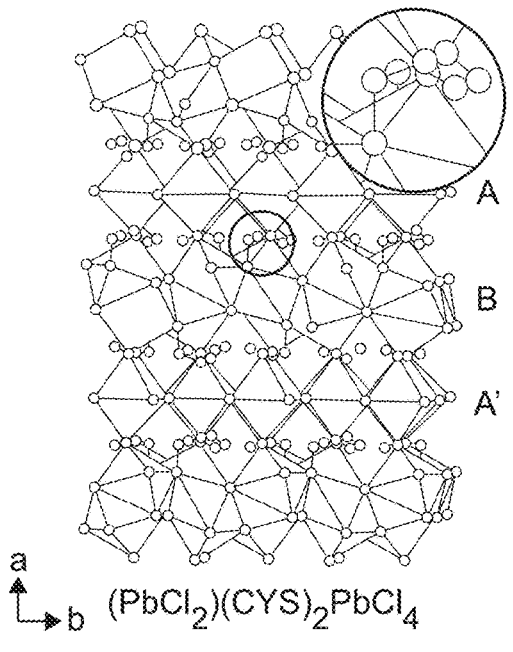
$(PbCl_2)(CYS)_2PbCl_4$
FIG. 3B
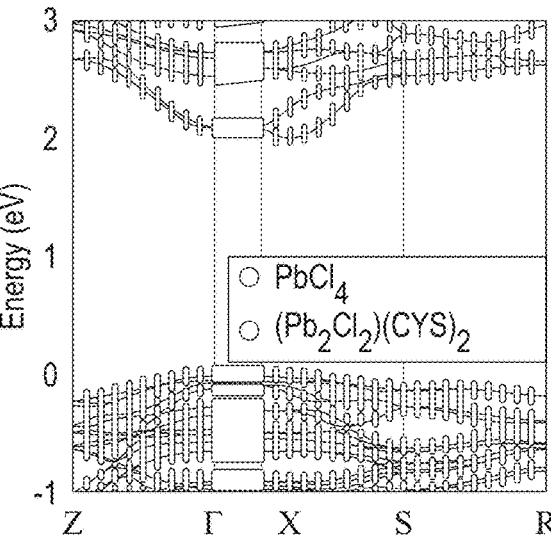
FIG. 3C
FIG. 3D

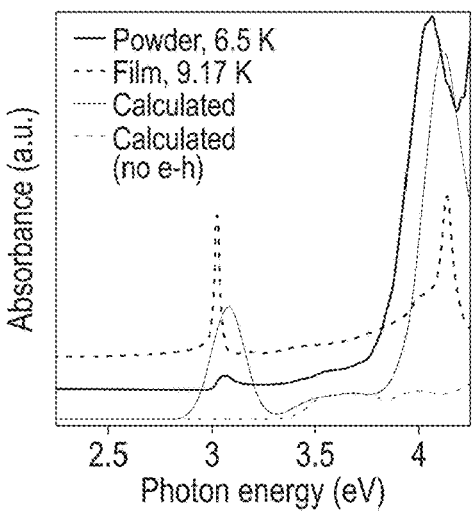
FIG. 3E
FIG. 3F
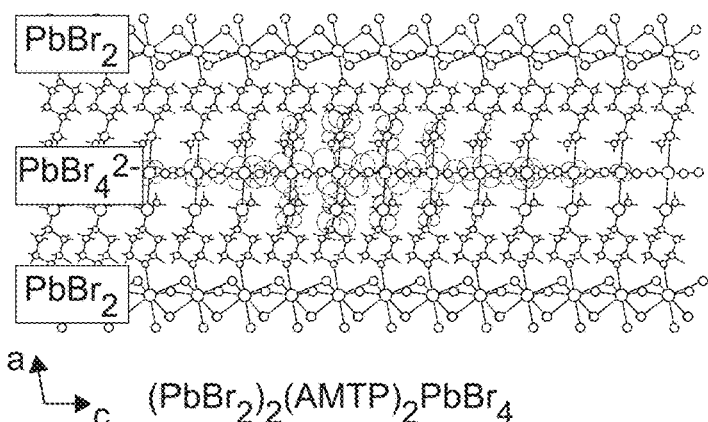
$(PbBr_2)_2(AMTP)_2PbBr_4$
FIG. 3G
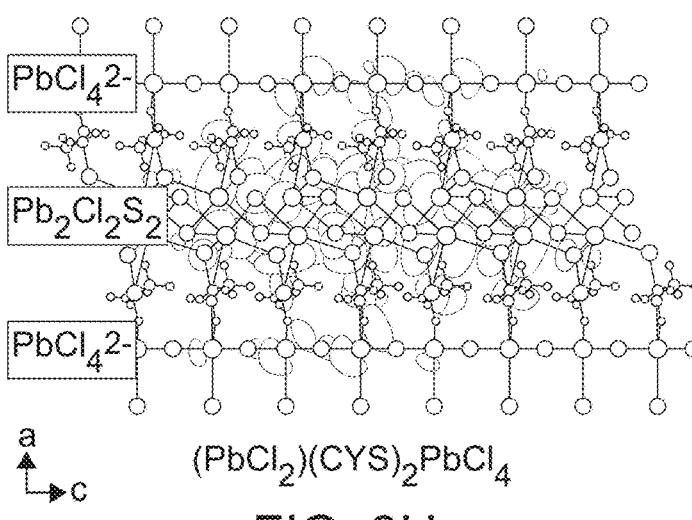
$(PbCl_2)(CYS)_2PbCl_4$
FIG. 3H

Extended Data Table 1 | Summary of lattice strains estimated for intergrowth slabs relative to non-intergrown parent structures

| Heterostructure | Intergrowth parent | Strain $\parallel a$ | Strain $\parallel b$ | Strain $\parallel ab$ | Volumetric strain |
|---|---|---|---|---|---|
| Li$_2$(taurine)$_2$CuCl$_4$ | $\alpha$-Li(NH$_4$)SO$_3$ [16] | 0.73% | 3.0% | 3.8% | -0.11% |
| Li$_2$(taurine)$_2$MnCl$_4$ | $\alpha$-Li(NH$_4$)SO$_3$ [16] | 0.53% | 2.3% | 2.8% | -2.4% |
| (Mg(H$_2$O)$_2$)(taurine)$_2$CuCl$_4$ | KMg(H$_{0.5}$SO$_4$)$_2$(H$_2$O)$_2$ [20] | 11.0% | -5.7% | 4.1% | 1.24% |
| (CuCl$_2$)$_4$(HIS)$_4$CuInCl$_8$ | (phthalazinium)CuCl$_2$ [24] | -1.3% | -0.94% | -2.5% | -0.84% |
| (Pb$_2$Cl$_2$)(CYS)$_2$PbCl$_4$ | PbCl$_2$ [25] | -2.6% | -2.6% | -5.2% | 5.5% |
| (PbBr$_2$)$_2$(AMTP)$_2$PbBr$_4$ | PbBr$_2$ [25] | -12.0% | -2.6% | -14.3% | -17.5% |

Extended Data Table 2 | Estimated strain in the perovskite slabs

| Heterostructure | Perovskite parent | Strain $\parallel a$ | Strain $\parallel b$ | Strain $\parallel ab$ | Volumetric strain |
|---|---|---|---|---|---|
| Li$_2$(taurine)$_2$CuCl$_4$ | (C$_3$H$_7$NH$_3$)$_2$CuCl$_4$ [18] | -3.8% | -2.0% | -5.7% | -4.5% |
| Li$_2$(taurine)$_2$MnCl$_4$ | (C$_2$H$_5$NH$_3$)$_2$MnCl$_4$ [54] | -2.2% | -0.99% | -3.1% | -1.6% |
| (Mg(H$_2$O)$_2$)(taurine)$_2$CuCl$_4$ | (C$_3$H$_7$NH$_3$)$_2$CuCl$_4$ [18] | 0.93% | -2.4% | -1.6% | -2.2% |
| (CuCl$_2$)$_4$(HIS)$_4$CuInCl$_8$ | (phenethylammonium)$_2$CuInCl$_8$ | -2.9% | -1.8% | -4.7% | -2.5% |
| (Pb$_2$Cl$_2$)(CYS)$_2$PbCl$_4$ | (C$_3$H$_7$NH$_3$)$_2$PbCl$_4$ [26] | -4.2% | 10.7% | 7.0% | -7.96% |
| (PbBr$_2$)$_2$(AMTP)$_2$PbBr$_4$ | (C$_4$H$_9$NH$_3$)$_2$PbBr$_4$ [55] | -1.5% | -1.5% | -3.0% | -3.1% |

FIG. 5A

Extended Data Table 3| Relative strain tensors for the perovskite slabs

| Heterostructure | $\varepsilon_{xx}$ | $\varepsilon_{yy}$ | $\varepsilon_{zz}$ | $\varepsilon_{yz}$ | $\varepsilon_{xz}$ | $\varepsilon_{xy}$ |
|---|---|---|---|---|---|---|
| Li$_2$(taurine)$_2$CuCl$_4$ | −0.03806 | −0.0206 | 0.01555 | −0.022585 | 0.040635 | 0.00404 |
| Li$_2$(taurine)$_2$MnCl$_4$ | −0.0215 | −0.00987 | 0.01812 | 0.036995 | −0.036785 | 0.00702 |
| (Mg(H$_2$O)$_2$)(taurine)$_2$CuCl$_4$ | 0.00927 | −0.02406 | −0.00182 | 0.049645 | 0.04753 | 0.022 |
| (CuCl$_2$)$_4$(HIS)$_4$CuInCl$_8$ | −0.02917 | −0.01828 | 0.03846 | 0.11858 | 0.03411 | −0.00632 |
| (Pb$_2$Cl$_2$)(CYS)$_2$PbCl$_4$ | −0.04223 | 0.10717 | 0.01817 | 0 | 0 | 0 |
| (PbBr$_2$)$_2$(AMTP)$_2$PbBr$_4$ | −0.01481 | −0.01531 | 0.00058 | 0.02207 | 0.02734 | −0.0227 |

Extended Data Table 4| Relative strain tensors for the intergrowth slabs

| Heterostructure | $\varepsilon_{xx}$ | $\varepsilon_{yy}$ | $\varepsilon_{zz}$ | $\varepsilon_{yz}$ | $\varepsilon_{xz}$ | $\varepsilon_{xy}$ |
|---|---|---|---|---|---|---|
| Li$_2$(taurine)$_2$CuCl$_4$ | 0.00737 | 0.03043 | −0.00575 | 0.067015 | 0.166215 | −0.00546 |
| Li$_2$(taurine)$_2$MnCl$_4$ | 0.00531 | 0.02254 | −0.05005 | −0.01844 | −0.02118 | −0.00022 |
| (Mg(H$_2$O)$_2$)(taurine)$_2$CuCl$_4$ | 0.10961 | −0.05699 | −0.02479 | 0.022315 | 0.046105 | −0.07370 |
| (CuCl$_2$)$_4$(HIS)$_4$CuInCl$_8$ | −0.01327 | −0.00944 | 0.01688 | −0.00960 | 0.00272 | 0.04657 |
| (Pb$_2$Cl$_2$)(CYS)$_2$PbCl$_4$ | −0.02648 | −0.02632 | 0.11604 | −0.05143 | 0.00012 | 0 |
| (PbBr$_2$)$_2$(AMTP)$_2$PbBr$_4$ | −0.12031 | −0.02589 | −0.02735 | −0.09558 | −0.00002 | 0.00003 |

FIG. 5B b d a c

Table S1| Unit cells determined from Le Bail refinement of powder X-ray diffraction data.

| Space group | $(ROOH)_2CuCl_4$ | $(RPO(OH)_2)_2CuCl_4$ | $Li_2(taurine)_2CuCl_4$ | $Li_2(taurine)_2MnCl_4$ |
|---|---|---|---|---|
| | $P\bar{1}$ | $Pbca$ | $Pnma$ | $Pnma$ |
| $a$ (Å) | 6.9952(4) | 7.4117(6) | 10.354(4) | 10.3036(8) |
| $b$ (Å) | 8.1189(12) | 7.3951(5) | 30.7756(12) | 31.581(2) |
| $c$ (Å) | 17.999(5) | 34.4470(17) | 5.105(2) | 5.0801(4) |
| $\alpha$ (°) | 100.395(12) | 90 | 90 | 90 |
| $\beta$ (°) | 90.573(5) | 90 | 90 | 90 |
| $\gamma$ (°) | 92.277(3) | 90 | 90 | 90 |
| $V$ (Å³) | 1004.53(15) | 1888.18(19) | 1627(2) | 1656.3(3) |
| $wR$ | 2.9% | 3.4% | 4.6% | 4.4% |

Table S2| Unit cells determined from Le Bail refinement of powder X-ray diffraction data.

| Space group | $(Mg(H_2O)_2)(taurine)_2CuCl_4$ | $(PEA)_4CuInCl_8$ | $(Pb_2Cl_2)(CYS)_2PbCl_4$ | $(PbBr_2)_2(AMTP)_2PbBr_4$ |
|---|---|---|---|---|
| | $P2_1/m$ | $P2_1/c$ | $Ima2$ | $P2_1/c$ |
| $a$ (Å) | 5.211(2) | 17.373(6) | 53.447(2) | 22.238(6) |
| $b$ (Å) | 30.322(19) | 11.016(2) | 8.8058(4) | 8.3915(15) |
| $c$ (Å) | 5.373(3) | 10.831(4) | 7.4850(3) | 7.8942(16) |
| $\alpha$ (°) | 90 | 90 | 90 | 90 |
| $\beta$ (°) | 92.110(9) | 94.98(4) | 90 | 98.944(6) |
| $\gamma$ (°) | 90 | 90 | 90 | 90 |
| $V$ (Å³) | 848.3(13) | 2064.9(9) | 3522.8(3) | 1455.2(8) |
| $wR$ | 5.46% | 16.25% | 6.98% | 5.24% |

FIG. 24

Table S1. Crystallographic Data

| | (RCOOH)₂CuCl₄ ᵃ | (RPO(OH)₂)₂CuCl₄ ᵇ | (H₃O₂)₂(taurine)₂CuCl₄ | Li₂(taurine)₂CuCl₄ | (Mg(H₂O)₂)(taurine)₂CuCl₄ |
|---|---|---|---|---|---|
| Formula | C₁₆H₂₀N₂O₄CuCl₄ | C₆H₂₂N₂O₆P₂CuCl₄ | CuC₄H₂₀N₂O₈Cl₄S₂ | CuLi₂C₄H₁₄N₂O₆Cl₄S₂ | CuMgC₄H₁₈N₂O₈Cl₄S₂ |
| Temperature (K) | 296(2) | 296(2) | 100(2) | 296(2) | 100(2) |
| Crystal System | Triclinic | Orthorhombic | Monoclinic | Orthorhombic | Monoclinic |
| Space Group | $P\bar{1}$ | $Pbca$ | $P2_1/c$ | $Pnma$ | $P2_1/m$ |
| $a, b, c$ (Å) | 6.9839(10), 8.1112(11), 17.998(3) | 7.332, 7.3324(3), 34.6237(15) | 15.2973(7), 7.8013(3), 7.2777(3) | 10.391(2), 30.899(6), 5.1071(9) | 5.2002(3), 30.226(2), 5.3197 |
| $\alpha, \beta, \gamma$ (°) | 100.450(5), 90.610(5), 92.308(5) | 90/90/90 | 90, 103.742(2), 90 | 90, 90, 90 | 90, 92.661(2), 90 |
| $V$ (Å³) | 1001.6(2) | 1861.41(11) | 843.65(6) | 1639.8(5) | 835.24(10) |
| $Z$ | 2 | 8 | 2 | 4 | 2 |
| Radiation, $\lambda$ (Å) | Mo Kα, 0.71073 | Mo Kα, 0.71073 | Synchrotron, 0.72860 | Mo Kα, 0.71073 | Mo Kα, 0.71073 |
| 2θ Range for Data Collection (°) | 5.112 to 50.484 | 4.71 to 50.48 | 5.62 to 68.36 | 5.28 to 59.82 | 5.40 to 56.77 |
| Completeness to 2θ | 99.9% (2θ = 50.484°) | 99.9% (2θ = 52.722°) | 100.0% (2θ = 56.548°) | 100.0% (2θ = 57.39°) | 99.4% (2θ = 56.878°) |
| Data / Restraints / Parameters | 5137/0/257 | 1892/2/106 | 2092/6/112 | 2145/0/113 | 2116/0/128 |
| Goodness of Fit on $F^2$ | 1.059 | 1.130 | 1.079 | 1.075 | 1.051 |
| $R_1$ᶜ, $wR_2$ᵈ (>2σ(I)) | 0.0336, 0.0796 | 0.0186, 0.0486 | 0.0170, 0.0448 | 0.0269, 0.0648 | 0.0228, 0.0529 |
| $R_1$ᶜ, $wR_2$ᵈ (all data) | 0.0526, 0.0866 | 0.0198, 0.0499 | 0.0171, 0.0449 | 0.0373, 0.0688 | 0.0285, 0.549 |
| Largest Diff. Peak and Hole (e Å-3) | 0.759 and -0.296 | 0.506 and -0.250 | 0.431 and -0.296 | 0.467 and -0.343 | 0.452 and -0.425 |

ᵃRCOOH⁺ = 4-(ammoniomethyl)-benzoic acid. ᵃRPO(OH)₂⁺ = 3-(ammoniopropyl)-phosphonic acid. ᶜ$R_1 = \sum||F_o| - |F_c||/\sum|F_o|$. ᵈ$wR_2 = \{\sum[w(F_o^2 - F_c^2)^2]/\sum[w(F_o^2)^2]\}^{1/2}$.

FIG. 25A

Table S2. Crystallographic Data

| | (PEA)$_2$CuInCl$_8$[a] | (CuCl$_2$)$_2$(HIS)$_4$CuInCl$_8$[b] | (Pb$_2$Cl$_2$)$_2$(CYS)$_2$PbCl$_4$[c] | (PbBr$_2$)$_2$(AMTP)$_2$PbBr$_4$[d] | Li$_2$(taurine)$_2$MnCl$_4$ |
|---|---|---|---|---|---|
| Formula | C$_{32}$H$_{48}$N$_4$Cl$_8$CuIn | C$_{20}$H$_{44}$N$_{12}$Cl$_{16}$Cu$_5$In | C$_{3.72}$H$_{7.44}$Cl$_{6.07}$N$_{1.86}$Pb$_3$S$_{1.93}$ | C$_{12}$H$_{28}$Br$_8$N$_2$O$_2$Pb$_3$ | Li$_2$MnC$_4$H$_{14}$N$_2$O$_6$S$_2$Cl$_4$ |
| Temperature (K) | 296(2) | 296.15 | 296(2) | 100(2) | 296(2) |
| Crystal System | Monoclinic | Triclinic | Orthorhombic | Monoclinic | Orthorhombic |
| Space Group | $P2_1/c$ | $P\bar{1}$ | $Ima2$ | $P2_1/c$ | $Pnma$ |
| a, b, c (Å) | 17.3546(10), 11.0531(6), 10.8545(6) | 7.6445(3), 15.1306(6), 20.2075(8) | 53.510(5), 8.8064(7), 7.4849(6) | 122.1203(7), 8.3159(3), 7.8356(2) | 10.2356(7), 31.469(2), 5.0585(3) |
| $\alpha, \beta, \gamma$ (°), V (Å$^3$) | 90, 95.419(2), 90; 2072.8(2) | 98.7690(10), 95.3670(10), 90.0130(10); 2299.62(16) | 90, 90, 90; 3527.1(5) | 90, 99.313(2), 90; 1422.36(8) | 90, 90, 90; 1629.38(18) |
| Z | 2 | 2 | 8 | 4 | 4 |
| Radiation, $\lambda$ (Å) | Mo Kα, 0.71073 | Mo Kα, 0.71073 | Mo Kα, 0.71073 | Synchrotron, 0.7749 | Mo Kα, 0.71073 |
| 2θ Range for Data Collection (°) | 4.37 to 50.48 | 5.36 to 51.22 | 5.16 to 59.14 | 6.11 to 69.43 | 5.18 to 56.56 |
| Completeness to 2θ | 99.8% (2θ = 50.83°) | 99.9% (2θ = 51.378°) | 99.5% (2θ = 59.44°) | 99.8% (2θ = 62.23°) | 99.9% (2θ = 50.48°) |
| Data / Restraints / Parameters | 3815 / 0 / 190 | 8751 / 0 / 494 | 5043 / 1 / 180 | 3536 / 75 / 125 | 2057 / 0 / 101 |
| Goodness of Fit on $F^2$ | 1.034 | 1.023 | 1.040 | 1.018 | 1.101 |
| $R_1$[e], $wR_2$[f] (>2σ(I)) | 0.0325, 0.0669 | 0.0419, 0.0862 | 0.0319, 0.0837 | 0.0324, 0.0480 | 0.0261, 0.0592 |
| $R_1$[e], $wR_2$[f] (all data) | 0.0514, 0.0762 | 0.0842, 0.1029 | 0.0427, 0.0885 | 0.0532, 0.0519 | 0.0342, 0.0638 |
| Largest Diff. Peak and Hole (e Å$^{-3}$) | 0.463 and −0.366 | 1.537 and −0.778 | 2.382 and −1.725 | 0.431 and −0.296 | 0.79 and −0.36 |

[a]PEA$^+$ = 2-phenethylammonium. [b]HIS$^{2+}$ = histammonium. [c]CYS = cysteammonium. [d]AMTP$^+$ = (aminoethyl)-tetrahydropyran. [e]$R_1 = \sum||Fo| - |Fc||/\sum|Fo|$.
[f]$wR_2 = [\sum[w(Fo^2 - Fc^2)^2]/\sum[w(Fo^2)^2]]^{1/2}$.

FIG. 25B

DIRECTED ASSEMBLY OF LAYERED HETEROSTRUCTURES AS SINGLE CRYSTALS

RELATED APPLICATIONS

This application claims the benefit of U.S. Provisional Patent Application Ser. No. 63/210,737 filed on Jun. 15, 2021, which is incorporated herein by reference in its entirety.

STATEMENT REGARDING FEDERALLY SPONSORED RESEARCH OR DEVELOPMENT

This invention was made with Government support under contract DE-AC02-76SF00515 awarded by the Department of Energy. The Government has certain rights in the invention.

FIELD

The present disclosure relates to materials, methods, techniques, apparatus, and devices pertaining to layered heterostructures and in particular, to synthetic strategies for self-assembling layered heterostructures into large single crystals, powders, and films, which are useful in applications such as microelectronics and thin-film photovoltaics.

BACKGROUND

The bulk syntheses of layered heterostructures almost exclusively employ high-temperature solid-state synthetic techniques from which metal-oxide, -chalcogenide, -phosphide, and -halide based materials can be isolated. These materials form via a process called intergrowth, which is the crystallization of one structure on the face of another. More directed intercalation and ion exchange techniques have been developed in oxide perovskites for the post-synthetic preparation of microcrystalline Bi—O (Aurivillius) and halometallate intergrowths from Ruddlesden-Popper phases. However, the discovered structural diversity of these materials is limited and each structure stands as an exceptional example from a confined reaction space.

In contrast, layered organic-inorganic halide perovskites are renowned for their structural tunability and low-temperature syntheses. Layered perovskites with the composition $A_2MX_4$ ($A^{1+}$=organic or inorganic ion; $M^{2+}$=metal ion; $X^{1-}$=halide) are related to the 3D perovskite structure ($AMX_3$) by dimensional reduction: the conceptual excising of a portion—often a slice along a crystallographic plane—of a parent crystal structure through the formal addition of an ionic salt (e.g., AX).

In layered perovskites, $A^{1+}$ is often an alkylammonium cation that partitions the perovskite sheets by forming an organic bilayer. By tailoring the organic cation's structure, an extensive class of halide perovskites can be predictably synthesized.

SUMMARY

Disclosed herein is a synthetic method that will allow two different 2D inorganic materials to be merged or self-assembled into one material to provide a heterostructure with a different functionality, depending on the different inorganic layers and by the addition of organic molecules with two functional groups, where the first functional group (e.g., alkylammonium) templates or directs the formation of the first inorganic layer and the second functional group templates the intergrowth of a different 2D inorganic layer between the first inorganic layers.

2D halide perovskites are template by organoammonium cations ($^+H_3N$—R; R=neutral organic group), which provide charge compensation for the anionic metal-halide slabs ($BX_4^{2-}$; B is typically a 1+, 2+, or 3+ metal and X=Cl$^-$, Br$^-$, or I$^-$). With the inclusion of a neutral coordinating group at the tail of the organoammonium group, we can template the formation of a neutral inorganic slab between the perovskite sheets. Furthermore, inclusion of an anionic group at the tail of the organoammonium molecule templates the formation of a cationic inorganic slab between the perovskite sheets. By tuning the functional group at the tail of the organoammonium, many more neutral, cationic, and anionic inorganic 2D intergrowths can be formed. Importantly, longer organic molecules can be used to separate the two different inorganic slabs and shorter organic molecules can be used to even connect the two different inorganic slabs through shared atoms.

For example, but without limitation, luminescent, magnetic, conductive, and photoconductive materials can be coupled using this method. In other words, by coupling two different inorganic lattices together we can form materials that show a combination of those properties. In one exemplary embodiment, a magnetic lattice and a conductive lattice can be combined to show magnetoresistance. Further the heterostructure can show new emergent properties not seen in the individual 2D parent structures (e.g., excitons delocalized between both layers). In one exemplary embodiment, the materials, methods, techniques, etc. disclosed herein can be used in microelectronics for controlling a magnetic sublattice with an applied voltage or a conductive lattice with a magnetic field. In another exemplary embodiment, the materials, methods, techniques, etc. disclosed herein can be used in microelectronics for controlling interlayer excitons using an applied electric field etc.

Most prior art heterostructures are formed by manipulating one monolayer at a time (e.g., placing a $MoS_2$ monolayer on top of a $WS_2$ monolayer). Such manipulations are difficult to do in large scale.

The method disclosed herein is much more scalable allowing for gram-scale syntheses of heterostructures in water. While there are a few examples of intergrowths in solid-state structures, these are typically formed at high temperatures and do not have the compositional or electronic variability of our family of heterostructures that form at room temperature in water.

The method comprises, in various embodiments, providing at least one first inorganic material; providing a second inorganic material, which is the same or different from the first inorganic material; providing an organic molecule containing first and second different functional groups; and combining in a solution the at least one first inorganic material, the second inorganic material, and the organic molecule containing the first and second different functional groups; wherein the layered heterostructure self-assembles in the solution; and wherein the organic molecule containing the first and second different functional groups directs the formation of the layered heterostructure in the solution, the first functional group of the organic molecule templating a first layer of the heterostructure and the second functional group of the organic molecule templating a second layer of the heterostructure, which is different from the first layer of the heterostructure.

In various embodiments of the method, the solution comprises an aqueous solution or an organic solution.

In various embodiments of the method, the method further comprises: depositing a thin film of the layered heterostructure from the solution.

In various embodiments of the method, the layered heterostructure crystallizes in the solution.

In various embodiments of the method, the second layers of the layered heterostructure form between the first layers of the heterostructure.

In various embodiments of the method, the first layers of the layered heterostructure comprise perovskite or double perovskite layers and the second layers of the layered heterostructure comprise non-perovskite layers.

In various embodiments of the method, the perovskite or double perovskite layers each comprises a metal having an oxidation state of 1+, 2+, 3+, 4+, or 5+.

In various embodiments of the method, the perovskite or double perovskite layers each comprises Ag, Au, Tl, Cu, In, Pb, Sn, Cu, Cr, Mn, Fe, Ru, Sb, In, Tl, Mo, Sn, or Sb.

In various embodiments of the method, the perovskite or double perovskite layers each comprises $F^-$, $Cl^-$, $Br^-$ or $I^-$.

In various embodiments of the method, the perovskite or double perovskite layers are flat or corrugated.

In various embodiments of the method, the first and second layers extend in two dimensions in the layered heterostructure.

In various embodiments of the method, the organic molecule comprises organoammonium.

In various embodiments of the method, the organoammonium comprises 2-aminoethanesulfonic acid, histammonium, zwitterionic cysteamine, or 4-ammoniomethyl-tetrahydropyran.

In various embodiments of the method, the first and second functional groups are cationic, neutral, or anionic.

In various embodiments of the method, the layered heterostructure is operative as a microelectronic device.

A layered heterostructure comprises, in various embodiments, first layers interleaved with second layers, wherein the first layers comprise perovskite or double perovskite layers and the second layers comprise non-perovskite layers.

In various embodiments of the layered heterostructure, the perovskite layers or double perovskite layers are two-dimensional (2D).

In various embodiments of the layered heterostructure, the perovskite layers or double perovskite layers are 2D halide perovskite layers or double perovskite layers.

In various embodiments of the layered heterostructure, the non-perovskite layers are two-dimensional (2D).

In various embodiments of the layered heterostructure, the non-perovskite layers are one-dimensional (1D).

In various embodiments of the layered heterostructure, the perovskite layers and the non-perovskite layers are extended in length.

In various embodiments of the layered heterostructure, the perovskite layers or double perovskite layers and the non-perovskite layers are separated from each other by organic molecules.

In various embodiments of the layered heterostructure, the perovskite layers or double perovskite layers and the non-perovskite layers are in contact with each other.

In various embodiments of the layered heterostructure, the perovskite layers or double perovskite layers each comprises a metal having an oxidation state of 1+, 2+, 3+, 4+, or 5+.

In various embodiments of the layered heterostructure, the perovskite layers or double perovskite layers each comprises Ag, Au, Tl, Cu, In, Pb, Sn, Cu, Cr, Mn, Fe, Ru, Sb, In, Tl, Mo, Sn, or Sb.

In various embodiments of the layered heterostructure, the perovskite or double perovskite layers each comprises $F^-$, $Cl^-$, $Br^-$ or $I^-$.

In various embodiments of the layered heterostructure, the perovskite or double perovskite layers are flat or corrugated.

BRIEF DESCRIPTION OF THE DRAWING

FIG. 1b is a flow chart of an exemplary embodiment of a method for self-assembling a layered heterostructure, according to the present disclosure.

FIG. 3 schematically illustrates $(PbBr_2)_2(AMTP)_2PbBr_4$ (FIG. 3a) and $(Pb_2Cl_2)(CYS)_2PbCl_4$ (FIG. 3b) and single-crystal X-ray diffraction structures therefor. Insets show coordination of $AMTP^+$ and CYS to the intergrowths. DFT-PBE band structures of $(PbBr_2)_2(AMTP)_2PbBr_4$ (FIG. 3c) and $(Pb_2Cl_2)(CYS)_2PbCl_4$ (FIG. 3d) with orbital contributions from the perovskite and intergrowth sublattices. Experimental and calculated absorption spectra with (GW-BSE) and without (GW) electron-hole interactions for $(PbBr_2)_2(AMTP)_2PbBr_4$ (FIG. 3e) and $(Pb_2Cl_2)(CYS)_2PbCl_4$ (FIG. 3f). All calculated spectra are offset by +0.55 eV, to match the experimental onsets. Isosurfaces representing the spatial distribution of the lowest-lying optically active exciton for $(PbBr_2)_2(AMTP)_2PbBr_4$ (FIG. 3g) and $(Pb_2Cl_2)(CYS)_2PbCl_4$ (FIG. 3h).

FIG. 5a are Extended Data Tables 1 and 2. Extended Data Table 1 is a summary of lattice strains estimated for intergrowth slabs relative to non-intergrown parent structures and Extended Data Table 2 is the estimated strain in the perovskite slabs.

FIG. 5b are Extended Data Tables 3 and 4. Extended Data Table 3 is the relative strain tensors for the perovskite slabs and Extended Data Table 4 is the relative strain tensors for the intergrowth slabs.

In FIG. 7*b*, the dimensionally reduced product of a copper chloride perovskite as isolated in the single-crystal structure of (propylammonium)$_2$CuCl$_4$ and the previously reported layered crystal structure of hydronium triflate. In FIG. 7*c*, the structure directing functional groups are ammonium and sulfonate and these same interactions are shown in the compound (H$_3$O)$_2$(taurine)$_2$CuCl$_4$.

In FIG. 9*a*, the parent layered structure (PEA)$_4$CuInCl$_8$ and 1D chain structure (phthalazinium) CuCl$_2$ crystallize with structure directing hydrogen bonds between the organic molecules and the inorganic sublattices, and in FIG. 9*b*, the templated layered heterostructure (CuCl$_2$)$_4$(HIS)$_4$CuInCl$_8$.

FIG. 10*c* illustrates the templated layered heterostructures (PbBr$_2$)$_2$(AMTP)$_2$PbBr$_4$ and (Pb$_2$Cl$_2$)(CYS)$_2$PbCl$_4$.

FIG. 24 are tables S1 and S2 of Unit cells determined from Le Bail refinement of powder X-ray diffraction data.

FIGS. 25*a* and 25*b* are respective tables S1 and S2 of Crystallographic Data.

DETAILED DESCRIPTION

Disclosed herein is method for self-assembling layered extended two-dimensional (2D) perovskite-non-perovskite heterostructures into large single crystals, powders, and films in an aqueous or organic solution using a template perovskite intergrowth technique. The 2D perovskite layers can comprise perovskite or double perovskites. Using bifunctional organic molecules as directing or templating groups, layered heterostructures (wherein the layers are also referred to herein as slabs, sheets, lattices, sublattices) form as an interleaving of 2D perovskite (or 2D double perovskite) slabs with a different inorganic non-perovskite lattice, previously unknown to crystallize with perovskites and double perovskites. In many cases, these intergrown inorganic non-perovskite lattices are 2D congeners of canonical inorganic structure-types. Notably, this interleaving of inorganic structures can markedly transform the band structure. Optical data and first principles calculations show substantive coupling between the perovskite layers and the intergrowth layers, which leads to new electronic transitions distributed across both sublattices.

Figure 1A:
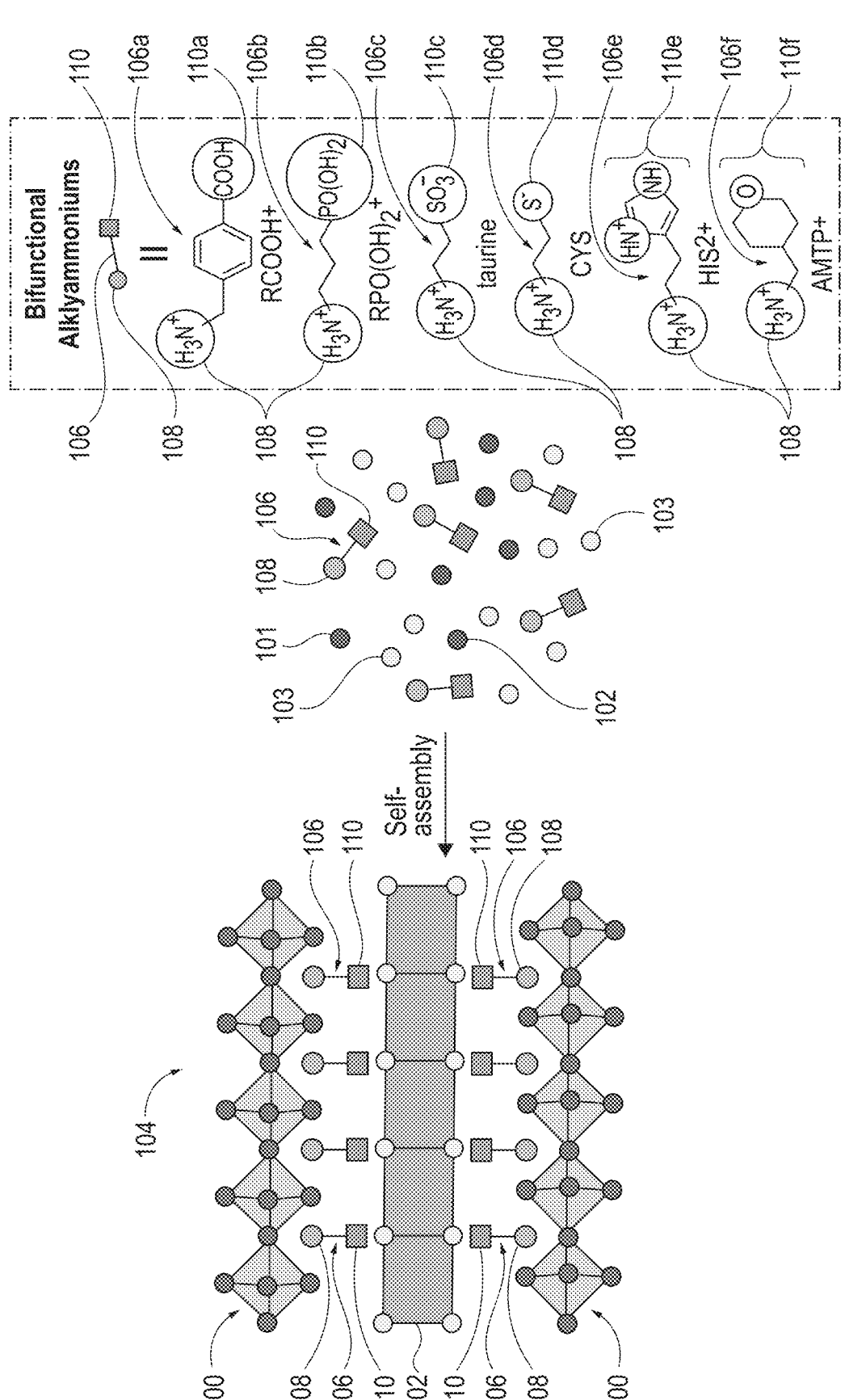
FIG. 1a schematically illustrates an exemplary embodiment of a method for self-assembling a layered heterostructure according to the present disclosure.

FIG. 1*a* schematically illustrates an exemplary embodiment of a method for self-assembling a layered heterostructure 104 according to the present disclosure. As depicted, the addition of a secondary functional group 110*a-f* to an organic group 106, 106*a-f* comprising an alkylammonium ion 108 directs or templates an intergrowth 102 of a different, inorganic non-perovskite, layer between the perovskite/double perovskite sheets 100. The term intergrowth is used herein to describe a recurrent co-crystallization of an extended non-perovskite metal-ligand bond network within an extended layered perovskite or double perovskite.

As described above, the method disclosed herein can couple a 2D perovskite or a 2D double perovskite extended lattice with a 1 D or 2D extended non-perovskite lattice. The perovskite or double perovskite can have metals of 1+, 2+, 3+, 4+, and/or 5+ oxidation states including, without limitation, $Ag^+$, $Au^+$, $Tl^+$, $Cu^+$, $In^+$, $Pb^{2+}$, $Sn^{2+}$, $Cu^{2+}$, $Cr^{2+}$, $Mn^{2+}$, $Fe^{2+}$, $Fe^{3+}$, $Sb^{3+}$, $In^{3+}$, $Tl^{3+}$, $Ru^{3+}$, $Mo^{3+}$, $Sn^{4+}$, and $Sb^{5+}$ and the halide can include $F^-$, $Cl^-$, $Br^-$ or $I^-$. The perovskite or double perovskite can also have several layers of metal-halide octahedra in each sheet (n=2, 3, etc.) and different orientations of the layers (e.g., (100) flat layers or (110) corrugated layers). The non-perovskite lattice can have a different composition and connectivity, some examples of which are described further on. The directing or templating organic groups can be cationic (e.g., $R—NH_3^+$), neutral (e.g., containing both positively and negatively charged groups; $^-X—R—NH_3+$) or anionic (e.g., $^-X—R$)

FIG. 1*b* is a flow chart of an exemplary embodiment of a method for self-assembling a layered heterostructure, according to the present disclosure, denoted generally by reference character 120. In step 122 of the method, one or two first inorganic material(s) is/are provided and in step 124 of the method, a second inorganic material is provided, which in some embodiments, is different from the one or two first inorganic material(s) or in other embodiments, is the same as the one first inorganic material or the same as one of the two first inorganic materials. As depicted in FIG. 1A, the first inorganic material 101 will produce perovskite or double perovskite layers 100 of the layered heterostructure 104 and the second inorganic material 103 will produce non-perovskite layers 102 intergrown between the perovskite or double perovskite layers 100 of the layered heterostructure 104.

In step 126 of the method, an organic molecule 106*a-f* (FIG. 1A) containing a first functional group $R—N_3H^+$ 108 where R=neutral organic group (FIG. 1A) and a second different functional group R—COOH 110*a*, $R—PO(OH)_2$ 110*b*, $R—SO_3^-$ 110*c*, $R—S^-$ 110*d*, $R—C_3N_2H_3$ 110*e*, or $R—C_5OH_9$ 110*f* (FIG. 1A) is provided. The organic molecule 106*a-f* (FIG. 1A) comprises organoammonium, (the first functional group), which directs or templates perovskite or double perovskite layers, and comprises a second different functional group that templates the intergrowth/non-perovskite layer(s) 102 between the perovskite or double perovskite layers 100 (FIG. 1A) of the layered heterostructure 104 (FIG. 1A). The organoammonium can comprise R—COOH+ 106*a*, R—PO(OH)x+ 106*b*, 2-aminoethanesulfonic acid 106*c*, zwitterionic cysteamine 106*d*, histammonium 106*e*, or 4-ammoniomethyl-tetrahydropyran 106*f*. The first functional group 108 (FIG. 1A) and the second functional group 110*a-f* (FIG. 1A) of the organoammonium 106*a-f* (FIG. 1A) can be cationic, neutral, or anionic. One of ordinary skill in the art will recognize that other suitable functional groups that are known to template other layered materials can be used in place of $R—N_3H^+$ as a first functional group.

In step 128 of the method, the first inorganic material, the second inorganic material, and the organic molecule containing the first and second different functional groups are combined in a solution. The solution can comprise an aqueous solution or an organic solution such as, but not limited to dimethylsulfoxide. The layered heterostructure self-assembles in the solution containing the first inorganic material, the second inorganic material, and the organic molecule containing the first and second different functional groups. During the self-assembly process, the first functional group of the organic molecule templates the perovskite or double perovskite layers of the layered heterostructure and the second functional group of the organic molecule templates the non-perovskite layers of the layered heterostructure.

In step 130, a thin film of the layered heterostructure is deposited from the solution using any suitable deposition method such as, but not limited to spin coating, wherein as the solution deposited on the spinning slide evaporates, the heterostructure material crystallizes out as a film, typically with the layers parallel to the face of the slide. Alternatively, the layered heterostructure can be crystallized in the solution as single crystals or polycrystalline powders in step 132.

Figure 2:
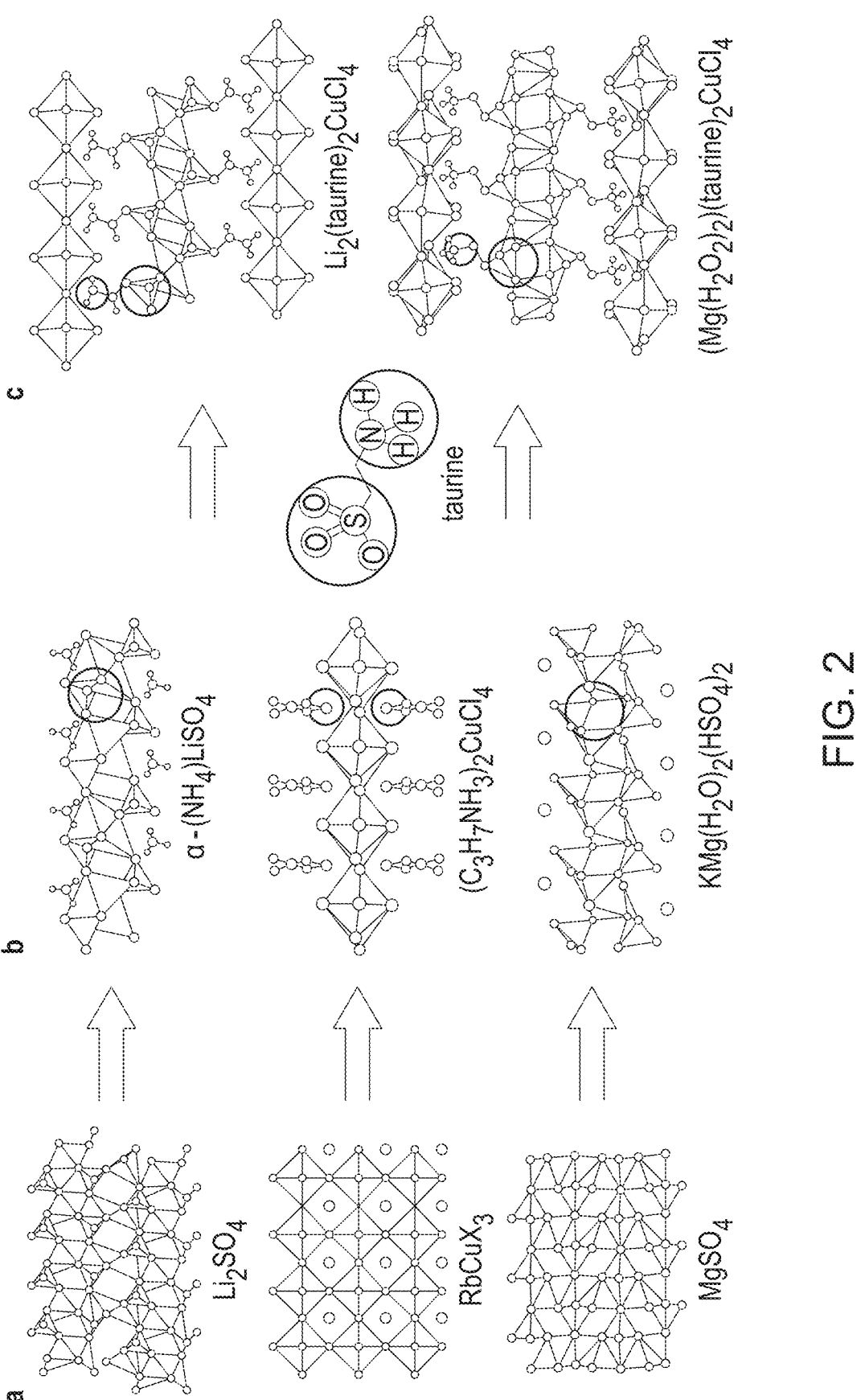
FIG. 2 schematically illustrates the conceptualized dimensional reduction of 3D parent structures (FIG. 2a) by the addition of an alkylammonium salt, a sulfate salt, or a water affords layered structures (FIG. 2b). The inclusion of two functional groups (alkylammonium and alkylsulfonate) in a single molecule directs the formation of the single-crystal heterostructures (FIG. 2c). The parent perovskite $RbCuCl_3$ is unknown, but $RbCuF_3$ is known.

In one exemplary embodiment, the method of the present disclosure selectively self-assembles a layered perovskite-non-perovskite heterostructure of $Li_2(taurine)_2CuCl_4$ by combining $CuCl_2$ and 2-aminoethanesulfonic acid ($^+H_3N$ $(CH_2)_2SO_3^-$; taurine) in 10-M aqueous (aq) LiCl, as schematically illustrated in FIG. 2*c*. The taurine is the organoammonium that templates the $CuCl_4$ perovskite through the $NH_3$ group and the Li-sulfonate intergrowth lattice through the $SO_3$ group between the $CuCl_4$ perovskite sheets.

In another exemplary embodiment, the method of the present disclosure selectively self-assembles a layered perovskite-non-perovskite heterostructure of $Li_2(taurine)_2$ $MnCl_4$ by combining of $MnCl_2$ and taurine in 10-M LiCl (aq). The taurine is operative in this embodiment as the organic templating group for directing the Li-sulfonate intergrowth lattice between the $MnCl_4$ perovskite sheets.

In another exemplary embodiment, the method of the present disclosure selectively self-assembles a layered perovskite-non-perovskite heterostructure of $(Mg(H_2O)_2)(tau$-rine$)_2CuCl_4$ by combining $CuCl_2$ and taurine in 5-M $MgCl_2$ (aq), as schematically illustrated in FIG. 2c. As in the previous embodiment, the taurine is operative in this embodiment as the organic templating group for directing the Mg-sulfonate intergrowth lattice between the $CuCl_4$ perovskite sheets.

In still another exemplary embodiment, the method of the present disclosure selectively self-assembles a layered double perovskite-non-perovskite heterostructure of $(CuCl_2)_4(HIS)_4CuInCl_8$ by combining CuCl, $In_2O_3$ and for histammonium $((C_5N_3H_{11})^{2+}$; HIS) in 12-M HCL(aq). The HIS is operative in this embodiment as the organic templating group for directing the $CuCl_2$ intergrowth lattice between the $CuInCl_8$ double-perovskite sheets.

In still another exemplary embodiment, the method of the present disclosure selectively self-assembles a layered per-ovskite-non-perovskite heterostructure of $(PbBr_2)_2(AMTP)$ $_2PbBr_4$, by combining $PbBr_2$ and 4-ammoniomethyl-tetra-hydropyran $(C_6H_{13}NO$; $AMTP^+)$ in 12-M HBr(aq), as schematically illustrated in FIG. 3a. The $AMTP^+$ is opera-tive in this embodiment as the organic templating group for directing the $PbBr_2$ intergrowth lattice between the $PbBr_4$ perovskite sheets.

In still a further exemplary embodiment, the method of the present disclosure selectively self-assembles a layered perovskite-non-perovskite heterostructure of $(Pb_2Cl_2)$ $(CYS)_2PbCl_4$, by combining lead salts and zwitterionic cysteamine $(^+NH_3(CH_2)_2S^-$; CYS) in 6-M NaCl(aq), as schematically illustrated in FIG. 3b. The CYS is operative in this embodiment as the organic templating group for direct-ing the $Pb_2Cl_2$ intergrowth lattice between the $PbCl_4$ perov-skite sheets.

Discussion

Acids in the Organic Layers.

Figure 4:
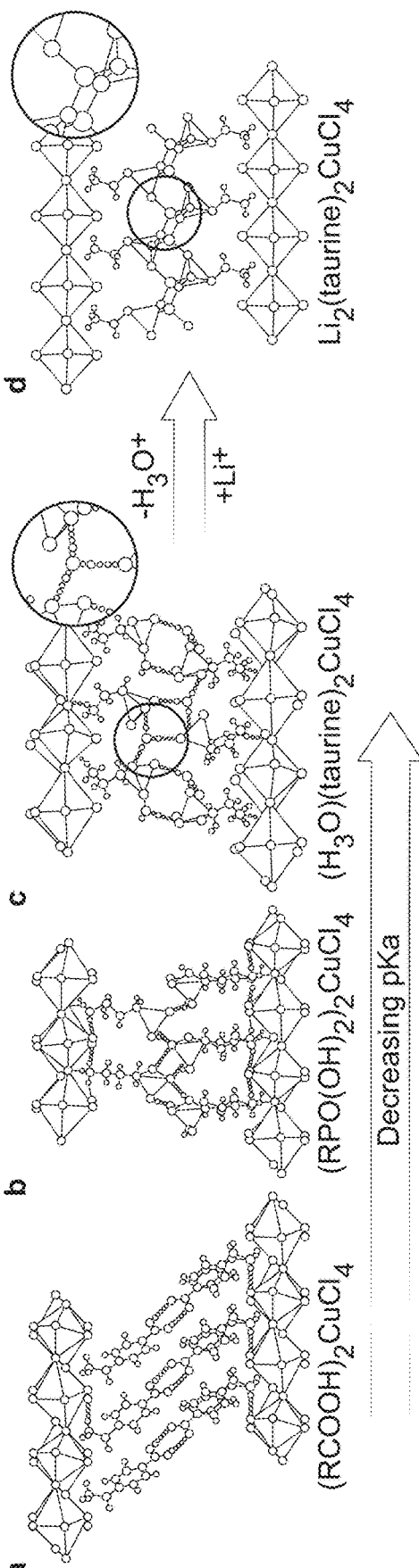
FIG. 4 schematically illustrates single-crystal structures of layered Cu—Cl perovskites with alkylammonium-oxyacid organic templates: $(RCOOH)_2CuCl_4$ (FIG. 4a); $(RPO(OH)_2)_2CuCl_4$ (FIG. 4b) and $(H_3O)_2(taurine)_2CuCl_4$ (FIG. 4c). Single-crystal structure of $Li_2(taurine)_2CuCl_4$ (FIG. 4d), which is related to that of $(H_3O)_2(taurine)_2CuCl_4$ by a conceptual ion exchange of $H_3O^+$ for $Li^+$ (insets).
Figure 6:
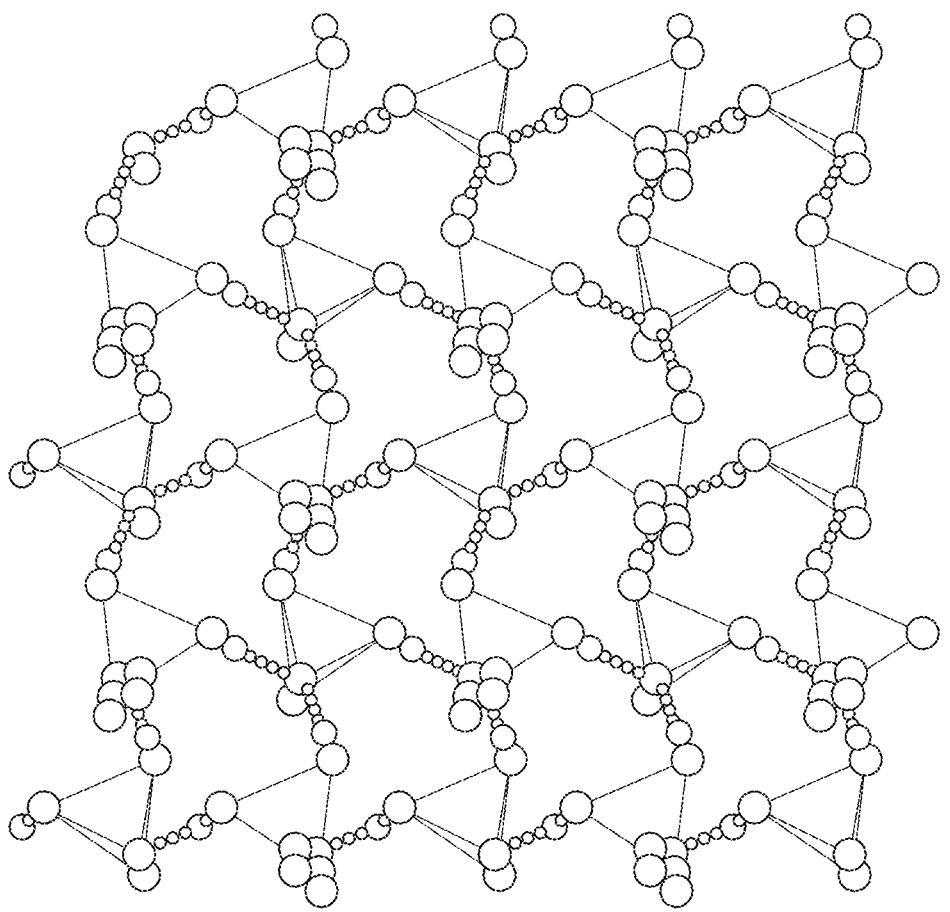
FIG. 6 schematically illustrates the crystal structure of $(RPO(OH)_2)_2CuCl_4$ viewed along the c-axis highlighting the hydrogen bond network in the organic bilayer. Carbon bonded hydrogens are not shown for clarity. Each phosphonic acid donates two hydrogen bonds and accepts two hydrogen bonds at the unprotonated oxygen atom. Each phosphonic acid hydrogen bonds only to phosphonic acid groups on the opposing face of the organic bilayer to form the checkerboard pattern illustrated.

In an aqueous 12-M HCl solution of $CuCl_2$, $^+R—COOH$ templates the crystallization of the layered perovskite $(R—COOH)_2CuCl_4$. The organic bilayer assembles as dis-crete acid dimers, as schematically depicted in FIG. 4a and as previously seen in other layered perovskites. Similarly, $(R—PO_3H_2)_2CuCl_4$ also crystallizes as a layered perovskite, as schematically depicted in FIG. 4b. However, the addi-tional hydrogen bond donors at the phosphonic acid tail, form a 2D hydrogen bond network between the perovskite sheets (FIG. 6).

Figure 7:
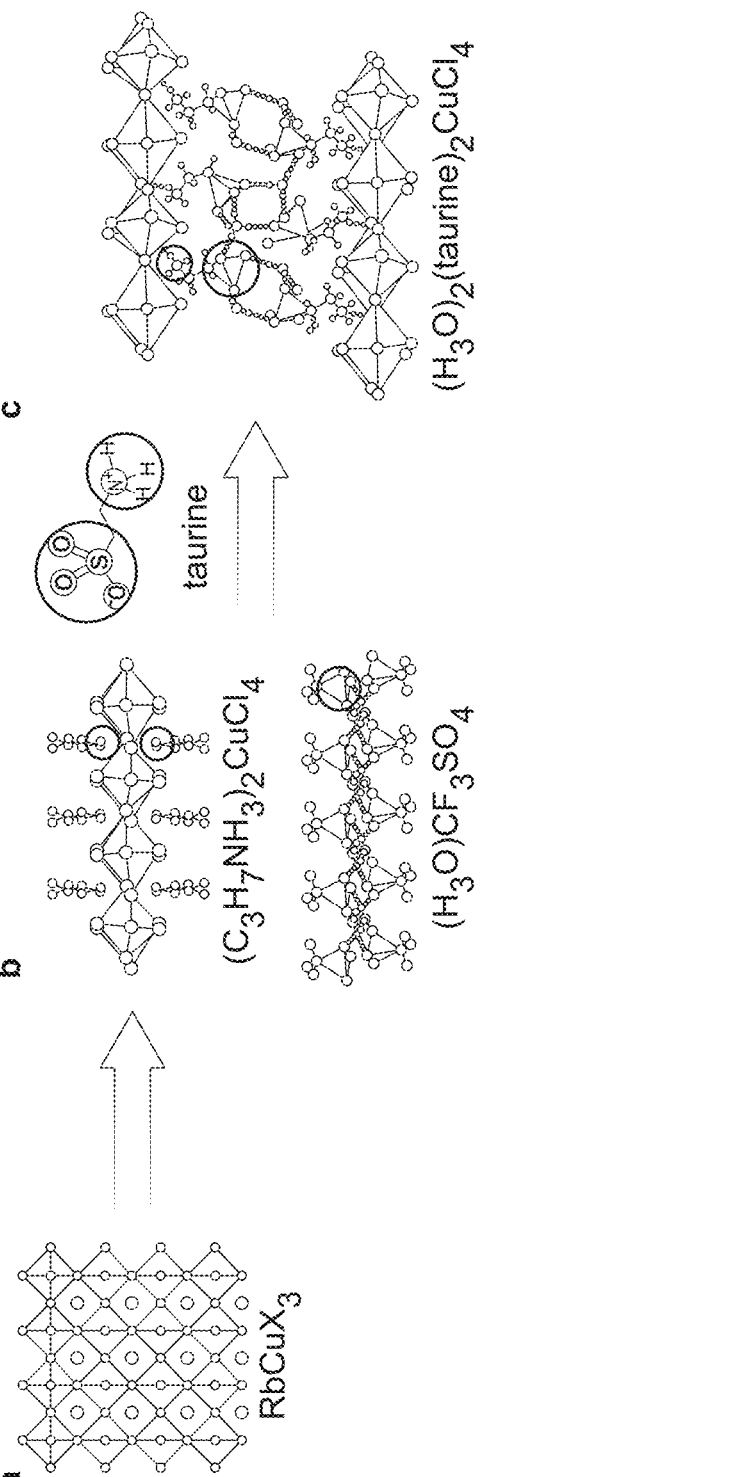
FIG. 7 schematically illustrates the templating of a hydronium sulfonate between layers of a $CuCl_4^{2-}$ perovskite sublattice. The archetypal parent 3D perovskite with the relevant slice highlighted in FIG. 7a. The parent structure RbCuCl$_3$ is unknown though RbCuF$_3$ is known.

Tauric acid is considerably more acidic than both $^+R—COOH$ and $^+R—PO_3H_2$, to the extent that even in 12-M HCl, the zwitterion, taurine $(^{+H}_3N—(CH_2)_2—SO_3^-)$, persists. Nonetheless, the layered perovskite $(H_3O)_2(tau$-rine$)_2CuCl_4$ crystallizes under similar reaction conditions. The crystals are deliquescent and decompose in vacuum and dry atmospheres. Since taurine is charge-neutral, the hydro-nium $(H_3O^+)$ cation is incorporated to balance the anionic perovskite sheet, affording an unusual case of a crystallo-graphically characterized $H_3O^+$, as schematically depicted in FIG. 4c. Remarkably, the 2D hydronium-sulfonate hydro-gen bond network is very similar to that in the layered structure of hydronium triflate $(CF_3SO_3^-·H_3O^+)$ (FIG. 7). However, here the lattice is corrugated in order to match lattice parameters with the perovskite sheets. Notably, this structure represents the templated intergrowth of a 2D inorganic structure within a perovskite.

Metals in the Organic Layers.

The co-crystallization of a 2D cationic sublattice in $(H_3O)$ $_2(taurine)_2CuCl_4$ through the inclusion of the zwitterion taurine motivated us to search for structures where taurine coordinates to a metal cation in place of hydronium. Since the zwitterionic taurine persists across all aqueous pH val-ues, and a high chloride concentration must be maintained in order to selectively crystallize $CuCl_x$ salts over $Cu(H_2O)_x$ salts, we used concentrated metal chloride solutions in place of HCl.

Solutions of $CuCl_2$ and taurine in 10-M LiCl(aq) selec-tively crystallize $Li_2(taurine)_2CuCl_4$, as schematically depicted in FIGS. 2c and 4d. Between the perovskite sheets, tetrahedral lithium ions are coordinated to the sulfonate tails within the taurine bilayer. This 2D templated intergrowth sublattice is isostructural with the metastable $\alpha$-$(NH_4)$ $LiSO_4$, as schematically depicted in FIG. 2b. Likewise, the intergrowth sublattice and $\alpha$-$(NH_4)LiSO_4$ are 2D congeners of the parent structure $Li_2SO_4$, sliced along the (001) plane (FIG. 2a). Therefore, we envision the single crystal $Li_2$ $(taurine)_2CuCl_4$ as a composite lattice of dimensionally reduced analogues of the parent ternaries $Li_2SO_4$ and per-ovskite. Note that a directly analogous $ACuCl_3$ 3D perov-skite remains unknown.

The commensurate co-crystallization of the perovskite and lithium sulfonate sheets necessitates that both structures occupy a shared unit cell. Using $\alpha$-$(NH_4)LiSO_4$ and $(C_3H_7NH_3)_2CuCl_4$ as reference structures, the lattice strain required to form such a heterostructure can be approximated for each 2D sublattice in FIGS. 5a and 5b (Extended Data Tables 1-4). From this analysis, we can quantify the degree to which each sublattice distorts to form an atom-perfect heterointerface in a manner analogous to lattice mismatch parameters often reported for interfaces formed by deposi-tion-based heteroepitaxy. However, because single-crystal X-ray diffraction affords 3D atomic coordinates and unit cell dimensions, we can calculate a 3D strain tensor for the primitive cell of each sublattice and visualize a trajectory through which the lattice distorts by animating atom dis-placements.

The relative strain found for the sulfonate slab is accom-modated by a slight dihedral rotation along the 1D Li—O chains of vertex-sharing tetrahedra. The 3.8% areal expan-sion of the lithium sulfonate slab in FIG. 5a (Extended Data Table 1) is complementary to the 5.7% contraction of the perovskite slab and, is mostly accounted for by distortion along a single axis. In the isostructural $Li_2(taurine)_2MnCl_4$, we observe a smaller but similar distortion.

Figure 8:
FIG. 8 schematically illustrates a slab for magnesium intergrowth in (Mg(H$_2$O)$_2$)(taurine)$_2$CuCl$_4$ (FIG. 8*a*), the reference structure KMg(H$_{0.5}$SO$_4$)$_2$·2(H$_2$O) (FIG. 8*b*), the slab for the lithium intergrowth in Li$_2$(taurine)$_2$CuCl$_4$ (FIG. 8*c*) and the reference structure α-Li(NH$_4$)SO$_4$ (FIG. 8*d*).

Using 5-M $MgCl_2$(aq) in place of 10-M LiCl(aq), an extended magnesium sulfonate forms as the intergrowth in $(Mg(H_2O)_2)(taurine)_2CuCl_4$, as schematically depicted in FIG. 2c. The magnesium sulfonate hydrate slab is essentially isostructural to that in $KMg(H_{0.5}SO_4)_2·2H_2O$ (FIG. 2b), which in turn can be derived from 3D $MgSO_4$ sliced along the (001) plane (FIG. 2a). This intergrowth sublattice fea-tures 1D chains of sulfonate-bridged, $Mg(H_2O)_2^{2+}$ ions hydrogen bonded to neighboring chains to form a 2D network (FIG. 8). In comparison to $KMg(H_{0.5}SO_4)_2·2H_2O$, the magnesium sulfonate sublattice displays an in-plane expansion of 4.1%, and a dramatic elongation of the mag-nesium sulfonate chains of 11%. This is largely accommo-dated for by tilting the bridging sulfonates.

Intergrowths in Double Perovskites.

Figure 9:
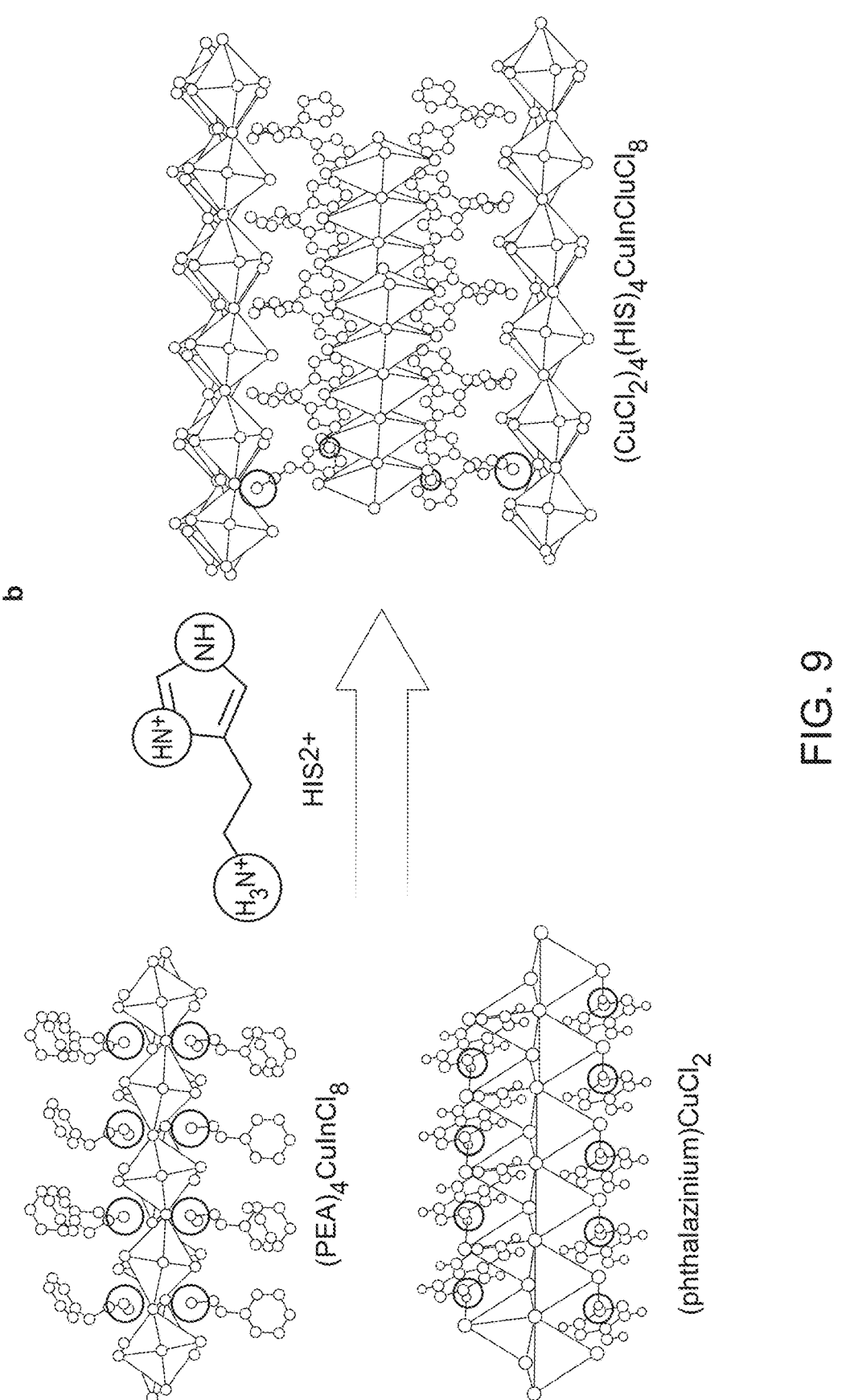
FIG. 9 schematically illustrates templating of a hetero-structure with CuInCl$_8$ double perovskite layers and anionic chains of CuCl$_2{}^{1-}$.

The structural diversity of halide double perovskites, where an ordered combination of two different metal cations occupy the octahedral sites, can also be expanded by tem-plating intergrowths. We found that the phenethylammo-nium cation $(PEA^+)$ templates the layered double perovskite $(PEA)_4Cu^IIn^{III}Cl_8$, where the metals in the $CuInCl_8^{4-}$ slabs form an ordered checkerboard. Replacing $PEA^+$ with the histammonium dication $(HIS^{2+})$, under similar reaction con-ditions as for $(PEA)_4CuInCl_8$, affords the heterostructure $(CuCl_2)_4(HIS)_4CuInCl_8$ after several recrystallizations. In this structure, the same $CuInCl_8^{4-}$ sublattice is templated by the ethylammonium head of $HIS^{2+}$ while $(CuCl_2)_n^-$ chains of edge-sharing tetrahedra are templated by the imidazolium tail (FIG. 9). Although copper(I) halides are known for their structural diversity, the chain structure in $(CuCl_2)_4$ $(HIS)_4CuInCl_8$ is rare. Relative to an isostructural chain found in a phthalazinium salt, the intergrowth chain displays a linear contraction of 1.3% while the double perovskite slab contracts in plane by 4.7% relative to $(PEA)_4CuInCl_8$. Heterostructures of Perovskite and $PbX_2$ (X=Cl, Br).

While taurine and $HIS^{2+}$ both template perovskite inter-growths, the layers are well-separated, with weak electronic interactions between the perovskite and intergrowth sublat-tices. Seeking to reduce the distances between layers and incorporate softer metal-ligand interactions into the inter-growth we considered the smaller zwitterion cysteamine $(^+NH_3(CH_2)_2S^-; CYS)$.

Single crystals of the heterostructure $(Pb_2Cl_2)$ $(CYS)_2PbCl_4$, featuring a lead-chloride intergrowth, were isolated from a solution of lead salts and CYS in 6-M NaCl(aq). A subtle ordering of the CYS zwitterion affords two crystallographically distinct perovskite sublattices with an ABA'B stacking sequence (FIG. 3b) where A and A' are statistically disordered in about 1 of every 14 repeat units. Notably, the intergrowth is bonded to the perovskite slabs through a bridging chloride, resulting in a 3D lead-chloride network. The intergrowth sublattice can be derived from a slice cut along the (001) plane of 3D $PbCl_2$ (FIGS. 10 and 11), although such layered analogues of $PbX_2$ have not been isolated elsewhere. The intergrowth displays an in-plane contraction of 5.2%, relative to $PbCl_2$, accompanying a complementary 6.0% expansion of the perovskite sublattice relative to (propylammonium)$_2PbCl_4$.

Figure 10:
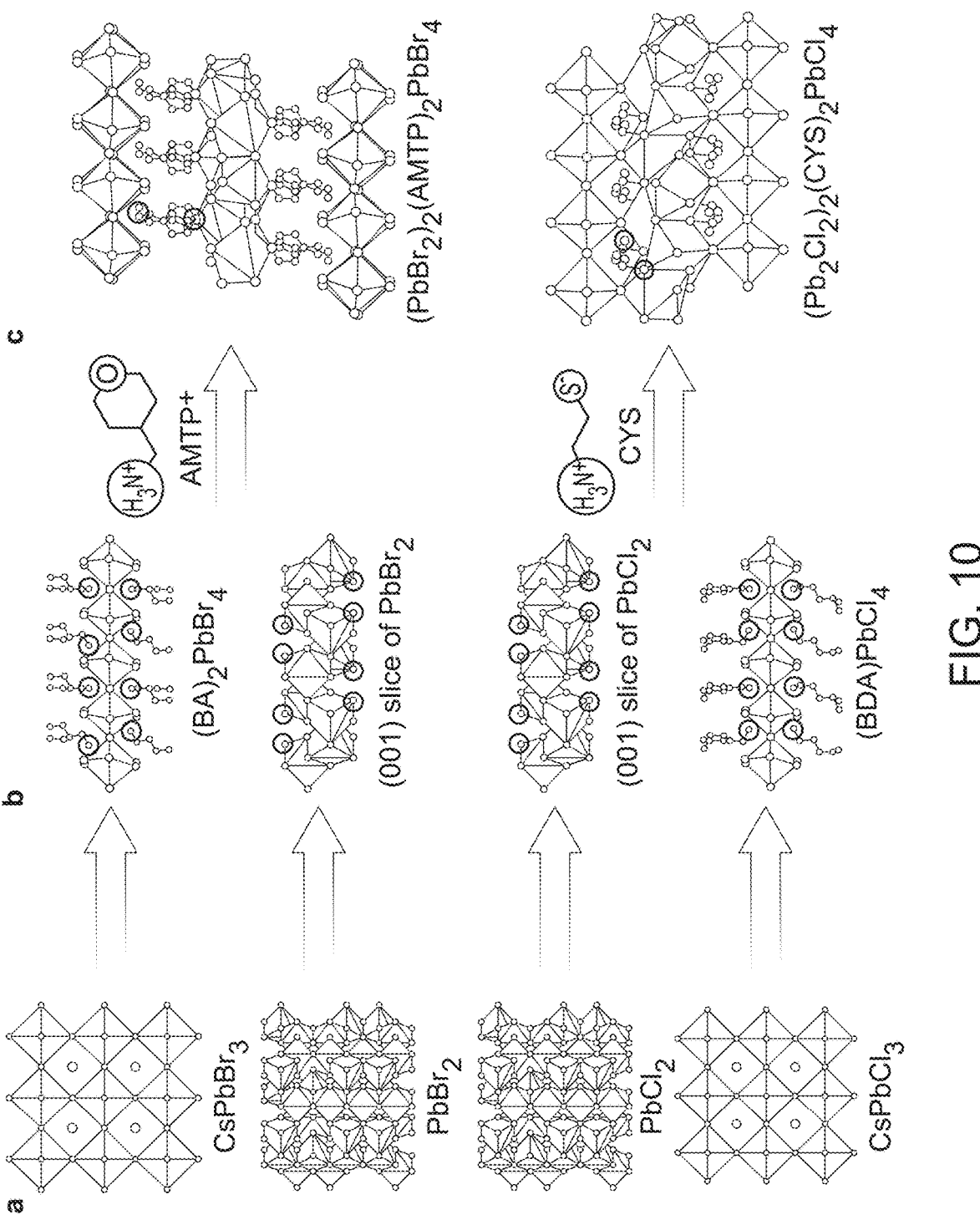
FIG. 10 schematically illustrates templating of hetero-structures containing layered lead-halide perovskites and layers derived from (001) slices of the PbX$_2$ (X=Cl, Br) structure-type. The parent 3D inorganic structures with relevant slices are highlighted in FIG. 10*a* and their dimensionally reduced progeny are illustrated in FIG. 10*b*. Note dimensionally reduced (001) slices of PbX$_2$ have not be isolated outside of the layered heterostructures reported here.
Figure 11:
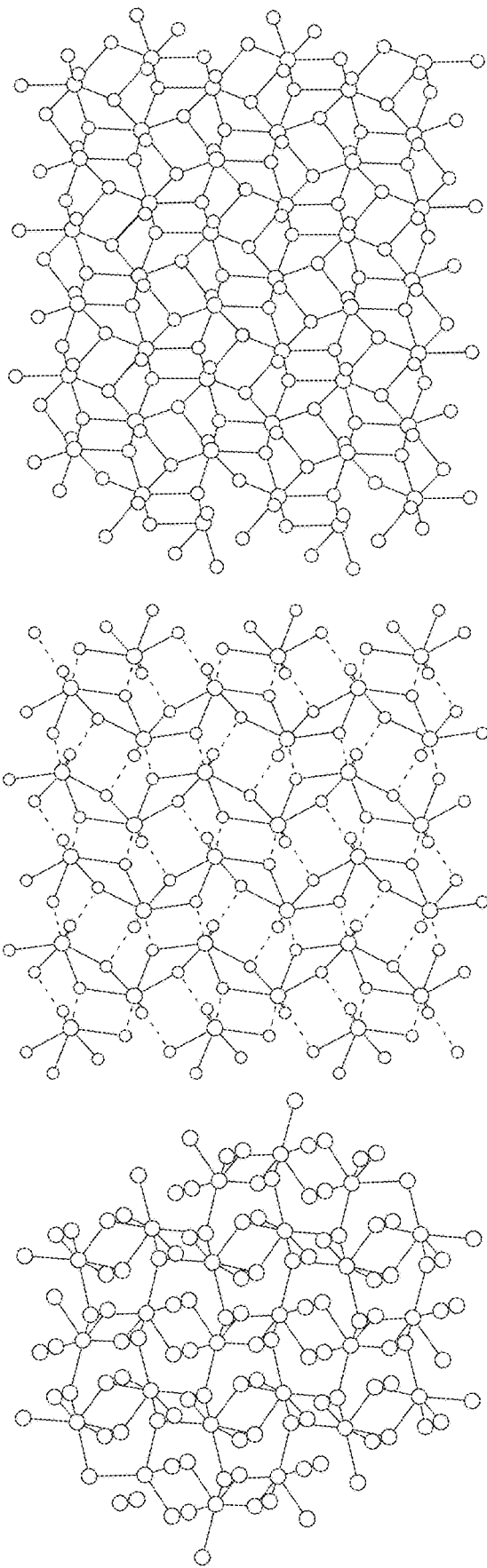
FIG. 11 schematically illustrates face-on comparisons of the (001) slab of PbCl$_2$ (left), which is isostructural to that of PbBr$_2$, to the intergrowth sublattices in (Pb$_2$Cl$_2$) (CYS)$_2$PbCl$_4$ (center) and (PbBr$_2$)$_2$(AMTP)$_2$PbBr$_4$ (right).

The heterostructure $(PbBr_2)_2(AMTP)_2PbBr_4$ (AMTP$^+$=4-ammoniomethyl-tetrahydropyran) is similar to $(Pb_2Cl_2)$ $(CYS)_2PbCl_4$, containing a $PbBr_2$ intergrowth that is iso-structural to 3D $PbBr_2$ sliced along the (001) plane (FIGS. 10 and 11). But here, the AMTP$^+$ charge balances the perovskite slab and a charge-neutral $PbBr_2$ intergrowth is templated by the tetrahydropyran tails, FIG. 3a. In contrast to $(Pb_2Cl_2)(CYS)_2PbCl_4$, the perovskite and intergrowth sheets are separated by the insulating organic cations. The areal strain of the perovskite sheet is comparable to those in other intergrowths (3.1%, contraction). However, the rela-tive strain of the $PbBr_2$(tetrahydropyran) slab compared to $PbBr_2$ is large, 14% contraction, originating from the formal substitution of terminal bromides in the $PbBr_2$ with smaller tetrahydropyran capping ligands in the intergrowth.
Electronic Structures of the Perovskite-$PbX_2$ Intergrowths.

The structural similarities between $(Pb_2Cl_2)(CYS)_2PbCl_4$ and $(PbBr_2)_2(AMTP)_2PbBr_4$ present a unique opportunity to explore how the interactions between the perovskite sheets and the $PbX_2$-like intergrowths impact their bulk electronic structures. Importantly, in the Pb—Cl structure the inter-growth is directly connected to the perovskite layer via the apical chloride of the perovskite sheet, whereas the inter-growth and perovskite layer are well separated by the organic layer in the Pb—Br structure.

For $(PbBr_2)_2(AMTP)_2PbBr_4$, our density functional theory (DFT) calculations reveal a band structure (FIG. 3c) that is similar to those of typical 2D lead-halide perovskites, with a direct gap between the conduction and valence band extrema, which are exclusively composed of electronic states within the perovskite sublattice. Consistent with this, the optical properties of $(PbBr_2)_2(AMTP)_2PbBr_4$ are like those of typical Pb—Br perovskites.

Figure 26:
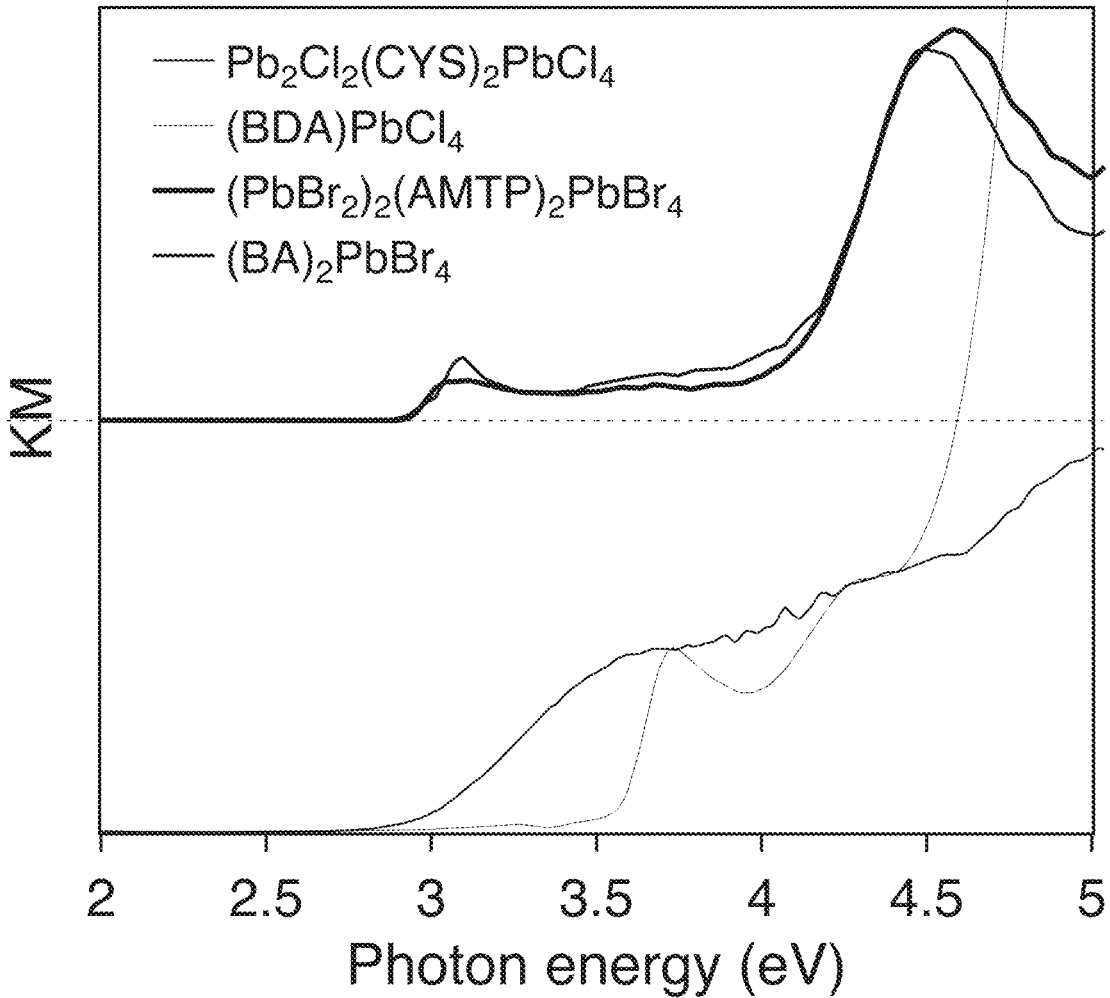
FIG. 26 graphically depicts room-temperature UV-vis diffuse reflectance spectra for the heterostructures (PbBr$_2$)$_2$ (AMTP)$_2$PbBr$_4$ and (Pb$_2$Cl$_2$)(CYS)$_2$PbCl$_4$ compared to those for the layered perovskites (BA)$_2$PbBr$_4$ (BA$^+$=butylammonium) and (BDA)PbCl$_4$ (BDA$^{2+}$=1,4-butanediammonium). All samples are powders. Reflectance spectra were converted to pseudo-absorbance spectra using the Kubelka-Munk (KM) equation.
Figure 27:
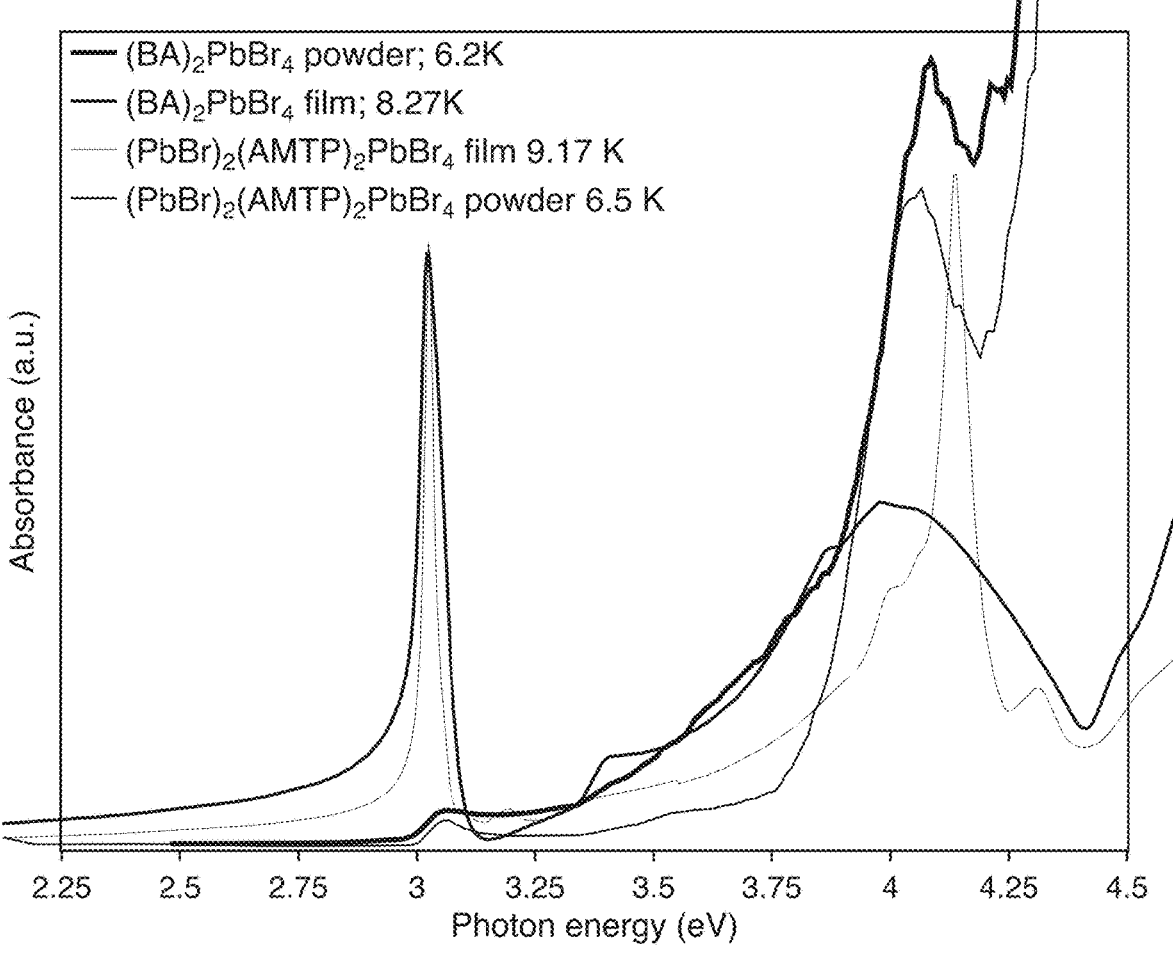
FIG. 27 graphically depicts comparisons between the low-temperature diffuse reflectance spectra (collected on powders; plotted as Kubelka-Munk transformed pseudo-absorbance) and transmittance measurements (collected on thin films) for the heterostructure (PbBr$_2$)$_2$(AMTP)$_2$PbBr$_4$ and the layered perovskite (BA)$_2$PbBr$_4$ (BA$^+$=butylammonium).
Figure 30:
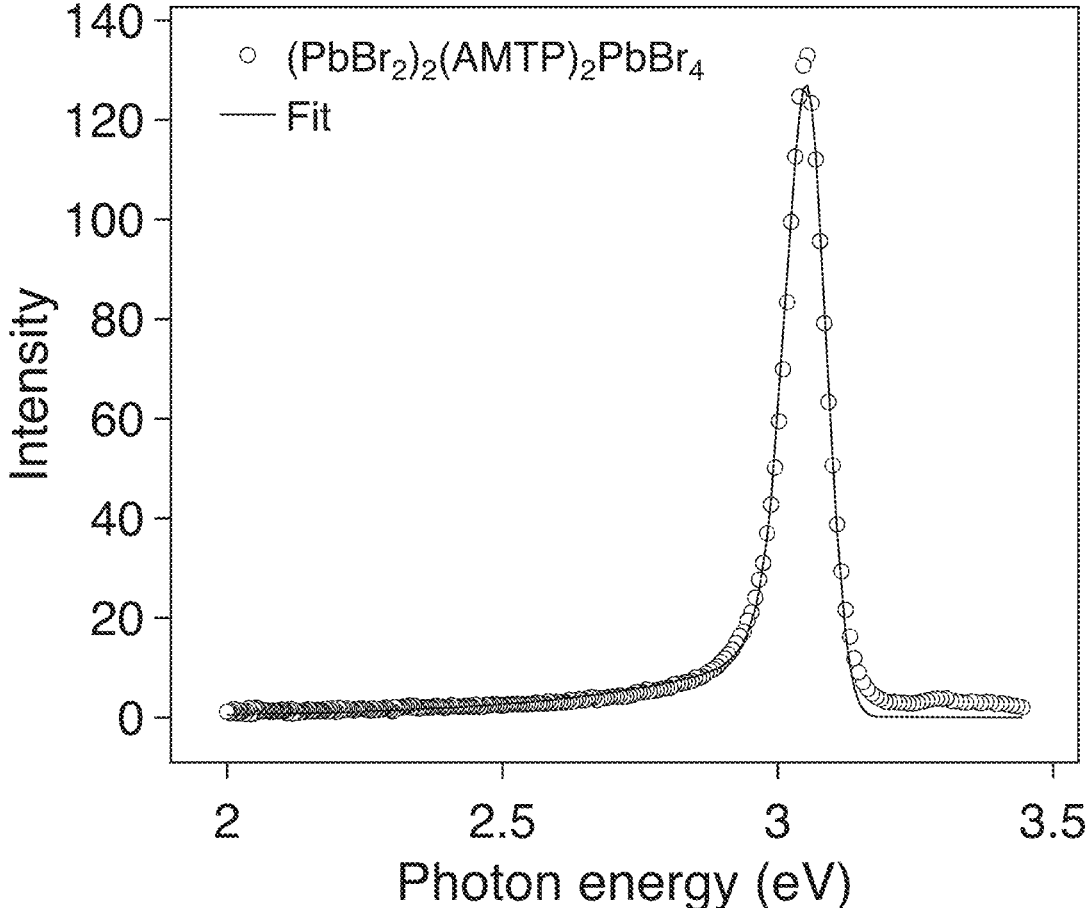
FIG. 30 graphically depicts the photoluminescence spectrum for the heterostructure (PbBr$_2$)$_2$(AMTP)$_2$PbBr$_4$ at room temperature. The spectrum was fit using an exponentially modified gaussian with two decay rates.

The low-temperature UV-vis diffuse reflectance spectrum and thin-film transmission spectrum for $(PbBr_2)_2$ $(AMTP)_2PbBr_4$ are shown in FIG. 3e (plotted as pseudo-absorbance and absorbance plots, respectively; see Meth-ods). The spectra show an excitonic absorption (from a bound electron-hole pair) at ca. 3.1 eV, which is separated from the onset of the continuum. These spectra are very similar to thin-film or powder spectra of the 2D perovskite (butylammonium)$_2PbBr_4$. As is the case for $(PbBr_2)_2$ $(AMTP)_2PbBr_4$, the excitonic absorbance in 2D perovskites is more pronounced in transmission spectra of oriented films, although it is evident in reflectance spectra of dilute powders as well (FIGS. 26 and 27). Powders of $(PbBr_2)_2$ $(AMTP)_2PbBr_4$ also display narrow blue (ca. 3.05 eV) excitonic photoluminescence at room temperature, as seen in most layered Pb—Br perovskites (FIG. 30).

Optical absorption spectra calculated using first principles many-body perturbation theory within the GW approxima-tion and the Bethe-Salpeter Equation (GW+BSE) are in good qualitative agreement with the measured spectra. The real-space representation of the square modulus of the exciton wave function—corresponding to the first excited state—reveals an expected localization of the bound elec-tron-hole pair within the perovskite layer (see FIG. 3g and Methods).

The band structure for a simplified model structure of $(Pb_2Cl_2)(CYS)_2PbCl_4$ (FIG. 12) shows state mixing between the intergrowth and the perovskite layers, due to the bridging chloride connecting the two layers. The bottom of the conduction band corresponds predominantly to states localized on the $Pb^{2+}$ ions of the perovskite sublattice. Unlike $(PbBr_2)_2(AMTP)_2PbBr_4$, the top of the valence band is primarily composed of states from the intergrowth sub-lattice, with more than 50% of the valence band top's composition attributed to the sulfur ions of the intergrowth layer. The intergrowth layer not only contributes directly to the shape and character of the valence band, but also indirectly to the dispersion of the conduction band, by inducing a strain in the perovskite lattice leading to a slightly indirect bandgap, ca. 70 meV lower than the direct gap at Γ.

Figure 28:
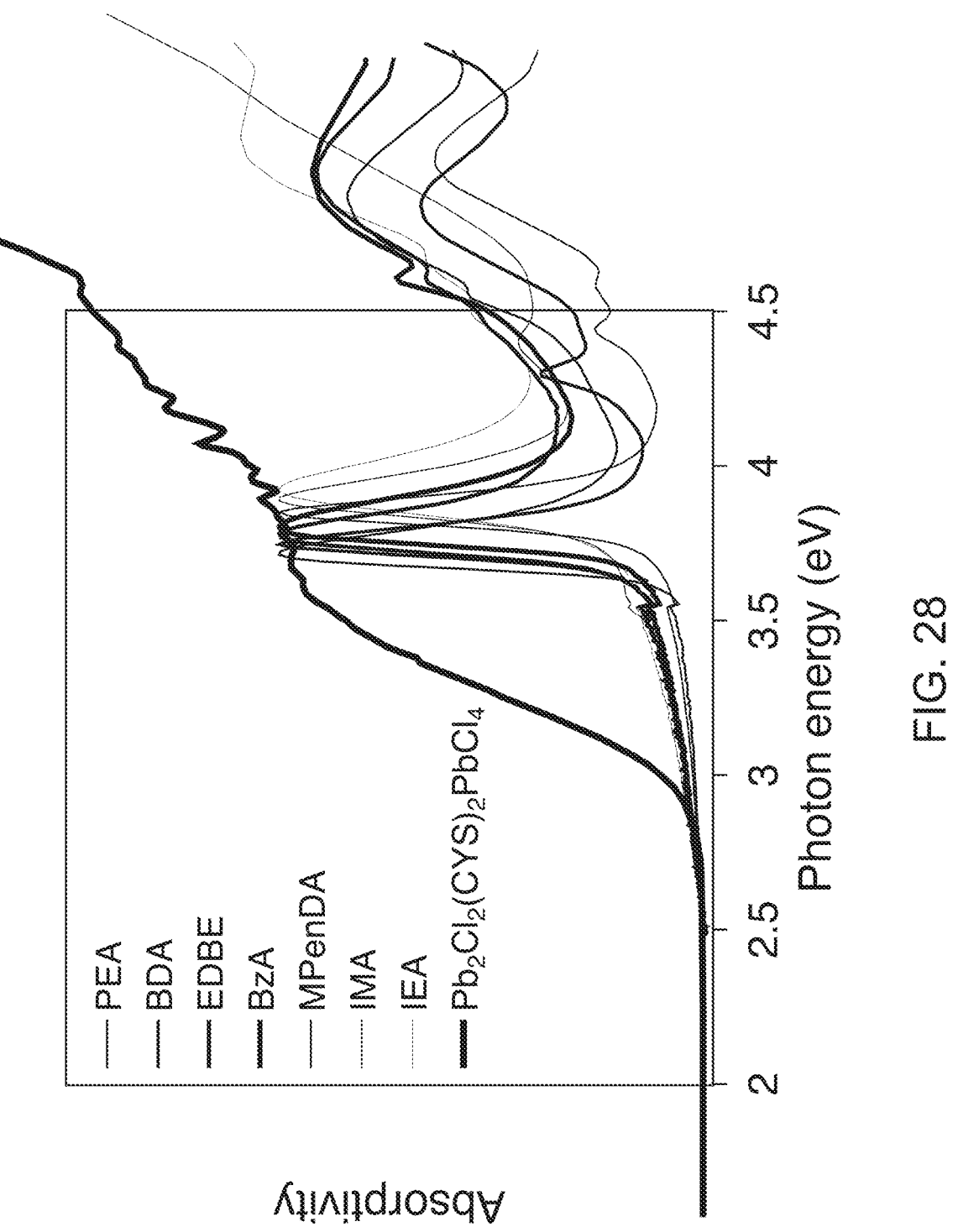
FIG. 28 graphically depicts a comparison of the room-temperature diffuse reflectance spectrum of (Pb$_2$Cl$_2$) (CYS)$_2$PbCl$_4$ powder (plotted as Kubelka-Munk transformed pseudo-absorbance) and several (001) layered lead chloride perovskite films with different 'A-site' cations: BzA$^+$=Benzylammonium, PEA$^+$=2-phenethylammonium, MPenDA$^+$=2-methyl-1,5-pentanediammonium, BDA$^{2+}$=1, 4-butanediammonium, EDBE$^{2+}$=2,2'-(ethylenedioxy)bis (ethylammonium), and IMA$^+$=(1H-imidazol-2-yl)methanammonium, IEA$^+$=2-(1H-imidazol-2-yl)ethan-1-ammonium. Likely due to the 3D connectivity of the Pb—Cl framework in (Pb$_2$Cl$_2$)(CYS)$_2$PbCl$_4$, it does not as readily crystallize as films.
Figure 29:
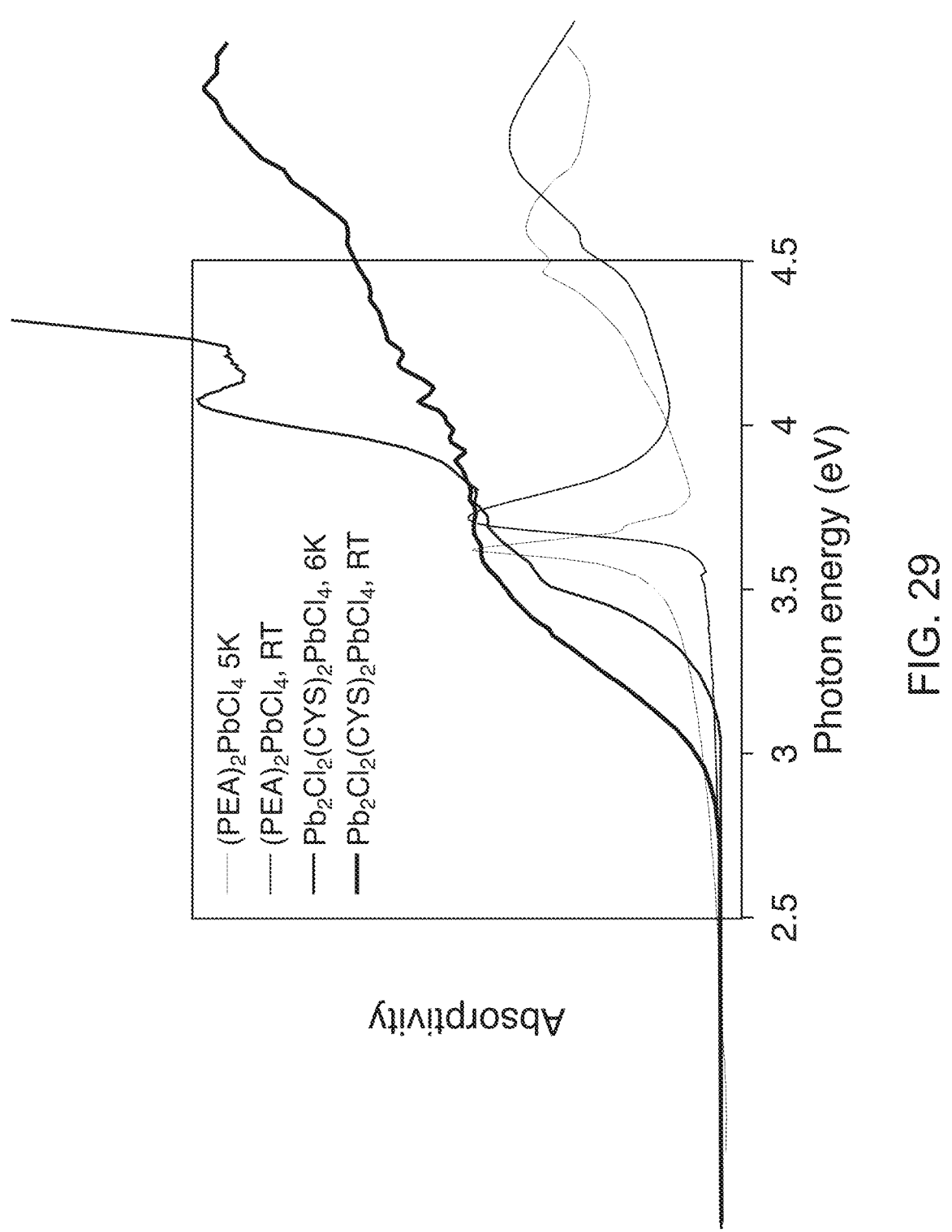
FIG. 29 graphically depicts a comparison of the UV-vis absorption spectra for (Pb$_2$Cl$_2$)(CYS)$_2$PbCl$_4$ powder (plotted as Kubelka-Munk transformed pseudo-absorbance) and (PEA)$_2$PbCl$_4$ (PEA$^+$=2-phenethylammonium) thin films at room temperature and near liquid helium temperatures (5-6 K). The perovskite (PEA)$_2$PbCl$_4$ has one of the lowest known exciton absorption energies for a (001) lead chloride perovskite (see FIG. 28).
Figure 31:
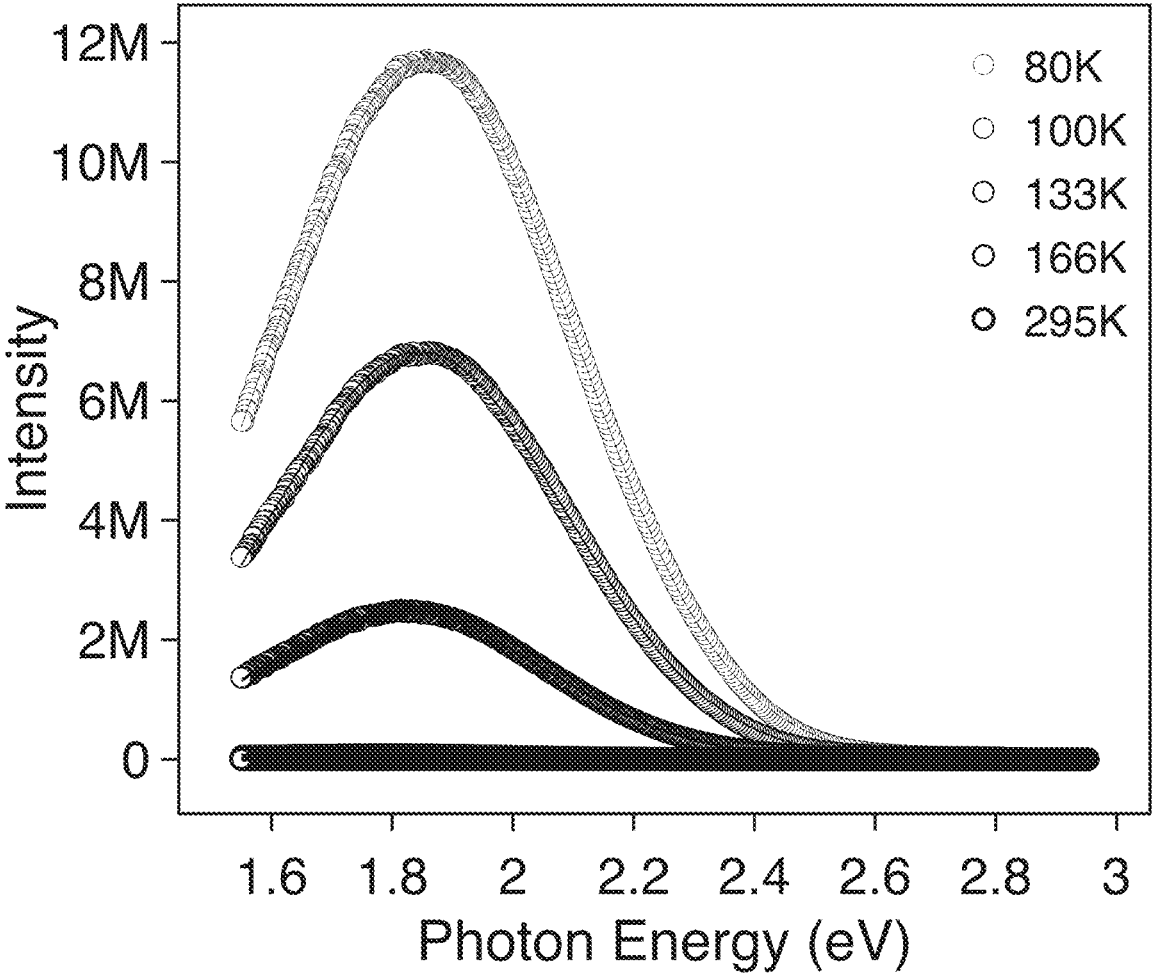
FIG. 31 graphically depicts the photoluminescence spectra for the heterostructure $(Pb_2Cl_2)(CYS)_2PbCl_4$. The spectra were fit (lines) using a gaussian function.

Interestingly, the intergrowth changes the optical proper-ties and charge distribution in $(Pb_2Cl_2)(CYS)_2PbCl_4$ com-pared to those of typical 2D Pb—Cl perovskites. Layered Pb—Cl perovskite films typically show a sharp excitonic absorption peak around 3.81(7) eV at room temperature (averaging data from 10 perovskites; FIGS. 28 and 29). In contrast, the room-temperature absorption spectrum of $(Pb_2Cl_2)(CYS)_2PbCl_4$ powder shows a significantly broad-ened absorption onset starting from ca. 3.0 eV with a plateau between 3.6 and 3.8 eV (FIG. 26). Likely due to the 3D Pb—Cl connectivity, $(Pb_2Cl_2)(CYS)_2PbCl_4$ does not readily form films. Photoluminescence spectroscopy at 80 K also reveals a broad, low-energy emission centered at 1.85 eV with a very large Stokes shift of about 1.8 eV (FIG. 31).

GW+BSE calculations performed on the ordered struc-tural model of $(Pb_2Cl_2)(CYS)_2PbCl_4$ predict a well-defined direct exciton at the onset of the optical spectrum (FIG. 3f). Notably, this computed peak corresponds to a delocalized excitonic state, which extends across both the intergrowth and perovskite layers (FIG. 3h), consistent with the relative orbital contributions of the valence band maximum and conduction band minimum. The experimental spectrum dis-plays a more complex structure of this feature, comprising several closely spaced peaks (FIG. 3f). These additional peaks may arise from indirect (phonon-assisted) excitons as well as from the presence of crystallographically unique perovskite sublattices and stacking faults that pervade the material, which are not accounted for in the calculated spectrum.

Methods

General Procedures and Methods

All reagent grade chemicals were acquired from commercial suppliers and used without further purification. Air-free syntheses and handling of air-sensitive materials were performed either in a nitrogen-filled glovebox or using standard Schlenk techniques. Solvents were column dried and degassed using a J. C. Meyer solvent system prior to use with air-sensitive compounds.

Relative Lattice Strain Estimations.

Sublattice strain tensors for both the perovskite and the intergrowth sheets in the single-crystal structures were determined relative to previously reported structures of the parent sublattices in simple layered compounds. The parent layered materials used as references were selected based on the structural similarity of the organic structures to the templating organic ammoniums in the intergrowths reported here in FIG. 5a (Extended Data Table 1). For each perovskite sublattice a primitive cell was constructed using symmetry equivalent terminal halides of the perovskite slab as lattice points. For each intergrowth, lattice points were selected as to include all the atoms in the parent sublattice. Engineering strain tensors were calculated using the derived primitive cells and the online software suite ISOTROPY and component program ISODISTORT. Relative linear, areal, and volumetric strains were calculated from the strain tensor, e, in Equation 1 as $$\varepsilon = \begin{bmatrix} \varepsilon_{aa} & \dfrac{\gamma_{ab}}{2} & \dfrac{\gamma_{ac}}{2} \\ \dfrac{\gamma_{ab}}{2} & \varepsilon_{bb} & \dfrac{\gamma_{bc}}{2} \\ \dfrac{\gamma_{ac}}{2} & \dfrac{\gamma_{bc}}{2} & \varepsilon_{cc} \end{bmatrix} \tag{1}$$

Where a, b, and c correspond to the axes of the primitive cell, and $g_{ab}$, $g_{ac}$, and $g_{bc}$ are the respective engineering shear strains. The fractional change in dimension is reported as $|e+I|$ for the corresponding submatrix where I is the identity matrix. These results are summarized in FIGS. 5a and 5b (Extended Data Tables 1-4).

Chemical structures are fundamentally discrete, therefore we find the most apt comparisons are those between the most similar structures available, as reported here. While the best possible structural comparisons are made using the most similar chemical structures available, the observed distribution of lattice parameters found in the halide perovskites may provide valuable insight as well. Surveying the Cambridge Structural Database, we note relative standard deviations from the average are <1.6% for perovskite lattice parameters (collated as the B-X-B distances where B is the octahedral cation) in perovskite and layered perovskite structures with different A-sites for the compositions A-Cu—Cl, A-Mn—Cl, A-Pb—Cl, and A-Pb—Br.

Animations of the relative atomic displacements between the observed sublattices in the heterostructures and their respective reference compounds (see FIG. 5a, Extended Data Table 1) were constructed by extracting an equivalent portion of each sublattice into a Cartesian coordinate system using the software suite Diamond 4.6 (Crystal Impact GbR). The two structures were overlaid and difference vectors were calculated for each equivalent atom pair. Intermediate frames were calculated by adding a linearly scaled fraction of the difference vector to the initial positions of the atoms in the reference parent structures. Each resulting animation illustrates the distortion from the reference compound to the sublattice found in the intergrowth.

Coordination Number and Bond Valence Sums.

Bond valence sums were determined for the purpose of consistently assigning the coordination number about each lead center in $PbCl_2$, $PbBr_2$, $(Pb_2Cl_2)_2(CYS)_2PbCl_4$, and $(PbBr_2)_2(AMPT)PbBr_4$. This was calculated using the software packages ToposPro 5.4 and the component program AutoCN, which determines the adjacency matrix, coordination numbers, contact classifications, and bond valence sums. For all calculations, Slater's radius of 1.80 Å was used for lead. By this method the accepted coordination assignments for $PbBr_2$ and $PbCl_2$ of [7+2] were determined.

Single-Crystal X-ray Diffraction. Crystals were coated with N-Paratone oil, mounted on a Kapton® loop, and transferred to a Bruker D8 diffractometer. Frames were collected using ω and ψ scans. The radiation source was Mo Kα-radiation (λ=0.71073 Å) for all samples except those that follow. For the compound $H_3O$ (taurine)$CuCl_4$ the radiation source was the synchrotron at the Advanced Light Source (ALS) (λ=0.72880 Å) on beamline 12.2.1. Single-crystal diffraction data for the compound $(PbBr_2)_2$$(AMTP)_2PbBr_4$ were collected at the ALS (beamline 11.3.1, λ=0.7749 Å).

Frames were integrated and corrected for Lorentz and polarization effects using SAINT V8.38A and were corrected for absorption effects using SADABS V2012. Space-group assignments were based upon systematic absences, E-statistics, agreement factors for equivalent reflections, and successful refinement of the structure. The structures were solved by direct methods, expanded through successive difference Fourier maps using SHELXT, and refined against all data using the SHELXL-2014 software package as implemented in Olex2. Weighted R factors, $R_W$, and all goodness-of-fit indicators are based on $F^2$. Summary diffraction and refinement statistics can be found in FIGS. 25a and 25b.

Powder X-Ray Diffraction.

Bulk powder samples were ground with a mortar and pestle and staged on a Bruker D8 advance diffractometer in a Bragg-Brentano θ-θ geometry. Diffraction patterns were collected between the 2θ angles of 5° and 60° using a Cu-Kα radiation source. The resulting patterns were matched to their corresponding unit cells determined by single-crystal X-ray diffraction using structureless Le Bail whole pattern fitting as implemented in the software package GSAS-II.

Diffuse Reflectance Measurements.

Samples for room-temperature diffuse reflectance measurements were collected using a Shimadzu-2600 UV-vis-NIR spectrophotometer with a $BaSO_4$ coated integrating sphere (Shimadzu ISR-2600). Sample reflectance was measured relative to $BaSO_4$ and samples were prepared by dilution of the sample to 2-5 wt % in a $BaSO_4$ powder mull.

Low-temperature diffuse reflectance measurements were collected using a Janis ST-100 helium-cooled cryostat outfitted with a temperature controller and fused quartz windows. Powder mulls of samples (1-3 wt %) in $BaSO_4$ were dispersed in a minimal volume of a solution of 1 wt % polymethylmethacrylate in toluene and drop-cast onto a copper sample mount attached to the cold head and aligned approximately parallel to the quartz window. The cryostat was mounted inside of an Agilent Cary-6000 UV-vis-NIR spectrophotometer equipped with Agilent's Universal Measurement Apparatus (UMA) that enables the measurement of reflectance spectra with independent control of the angles of incidence and reflectance at the sample. All samples were sufficiently micronized and milled into a large excess of $BaSO_4$ such that qualitatively no angular dependance of the reflectance spectra was observed. Reflectance spectra were converted to pseudo-absorbance spectra using the Kubelka-Munk equation.

Thin Film UV-Vis Absorption Spectroscopy.

Thin film samples deposited on quartz glass substrates were attached to the cold head of a liquid helium cooled cryostat with a sample chamber equipped with quartz glass windows mounted in a Cary 500 UV-vis-NIR spectrophotometer and transmission spectra were collected. In order to compare transmission spectra to diffuse reflectance spectra, the data were converted to absorbance units.

Simplified Structural Model of $(Pb_2Cl_2)(CYS)_2PbCl_4$.

Our best refinement of the single crystal X-ray diffraction data yielded 1) an orthorhombic crystal lattice with unit cell sizes 53.51 Å, 8.81 Å and 7.49 Å, consisting of 248 atoms in the unit cell, and 2) disordered occupation of sites of the intergrowth lattice, alternating between two different possible sites with occupation numbers of approximately 0.93 and 0.07, respectively. To obtain a structure amenable for electronic structure calculations, we constructed a simplified model for $Pb_2Cl_2)_2(CYS)_2PbCl_4$ using two approximations. Firstly, we observed that structural ordering that leads to the two unique perovskite slabs is subtle with very little difference in chemical bonding between the A and A' slabs in FIG. 3b. Using the software package VESTA, we reduced the length of the a-axis by half, effectively removing an a-glide⊥b from the structure (FIG. 12), and reduced the crystal symmetry of the unit cell to P1. Secondly, we fixed the Pb, S, and Cl ions in the intergrowth to the majority occupation sites. While halving the unit cell size along the a direction is not expected to affect the electronic structure of the system significantly, the disordered occupation of the intergrowth sites may have an impact on the shape of the valence band top. This disorder, along with indirect (phonon-assisted) excitons, may contribute to the multiple closely spaced peaks seen in the experimental optical spectrum, both of which are not captured in the calculated spectrum.

Electronic Structure Calculations.

Figure 12:
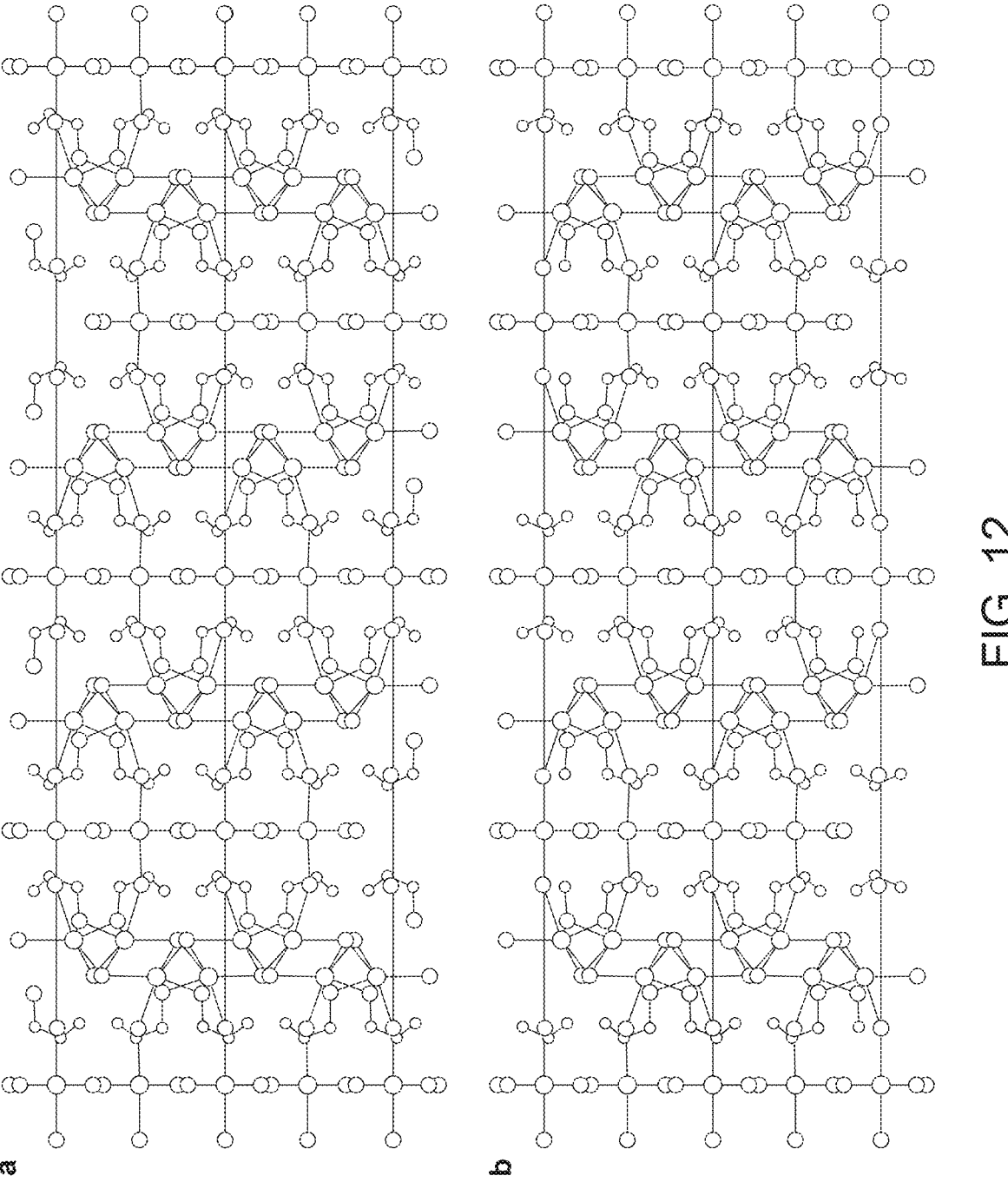
FIG. 12 schematically illustrates a comparison between the crystal structure (disordered atoms resolved for clarity) of (Pb$_2$Cl$_2$)(CYS)$_2$PbCl$_4$ (FIG. 12*a*) and the structural model used for calculation of absorption spectra and electron-hole interactions with half the unit-cell volume (FIG. 12*b*). Both structures are viewed along the c-axis. Unit-cell borders are shown with vertical and horizontal lines.
Figure 13:
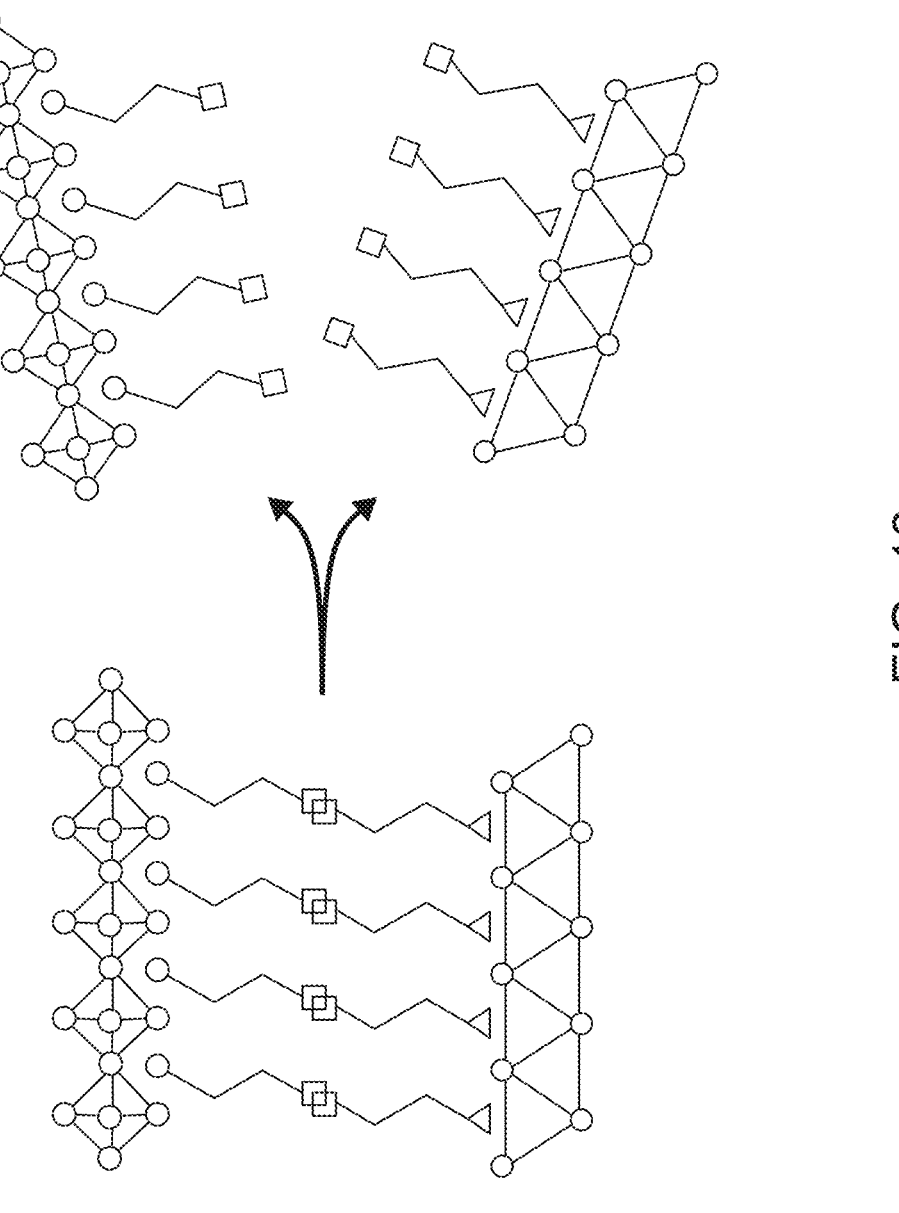
FIG. 13 schematically illustrates heterostructures with organic bilayers are expected to cleave along the organic layers, in analogy to 2D halide perovskites with organic bilayers.
Figure 14:
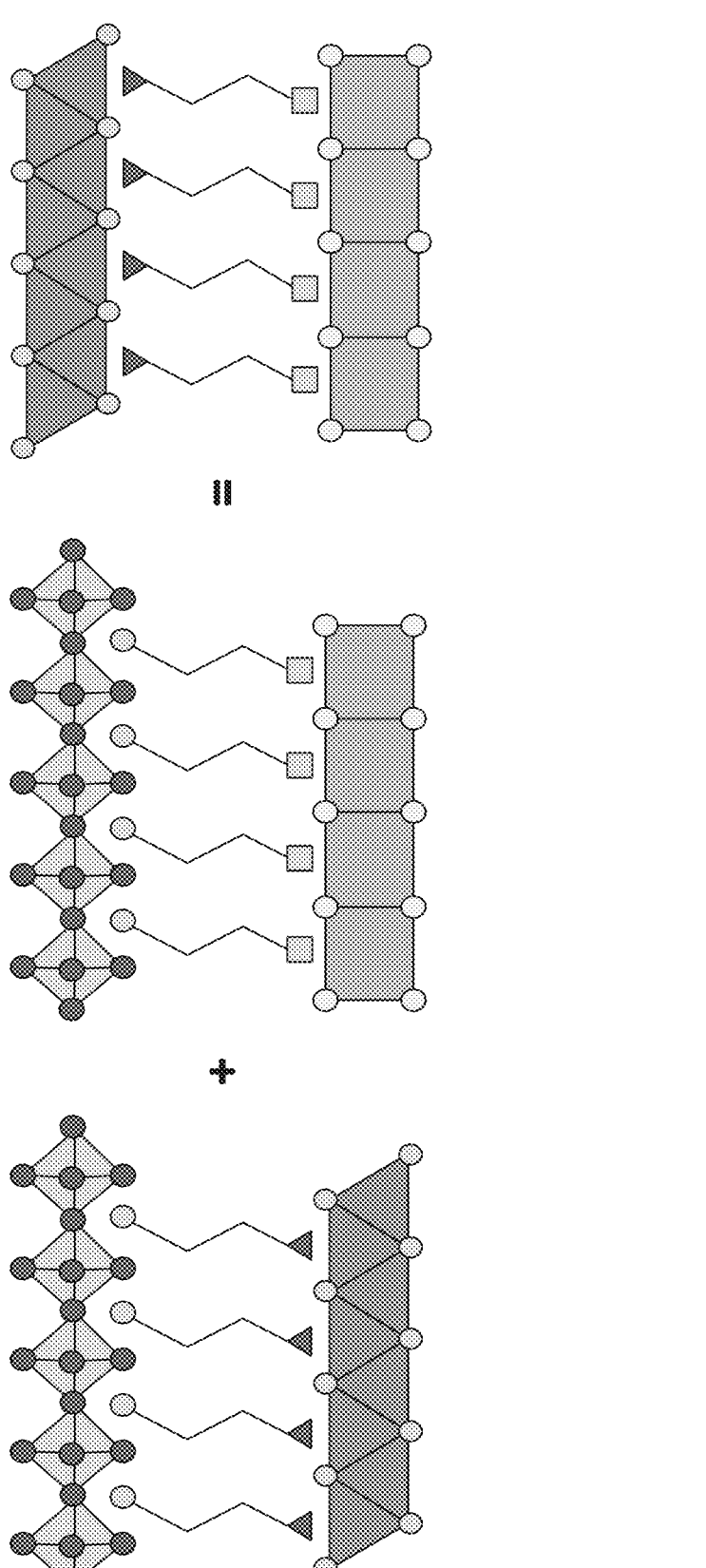
FIG. 14 schematically illustrates combining the functionalities that template intergrowths in perovskites (triangle and square) into a single bifunctional molecule is expected to predictably template new heterostructures.
Figure 15:
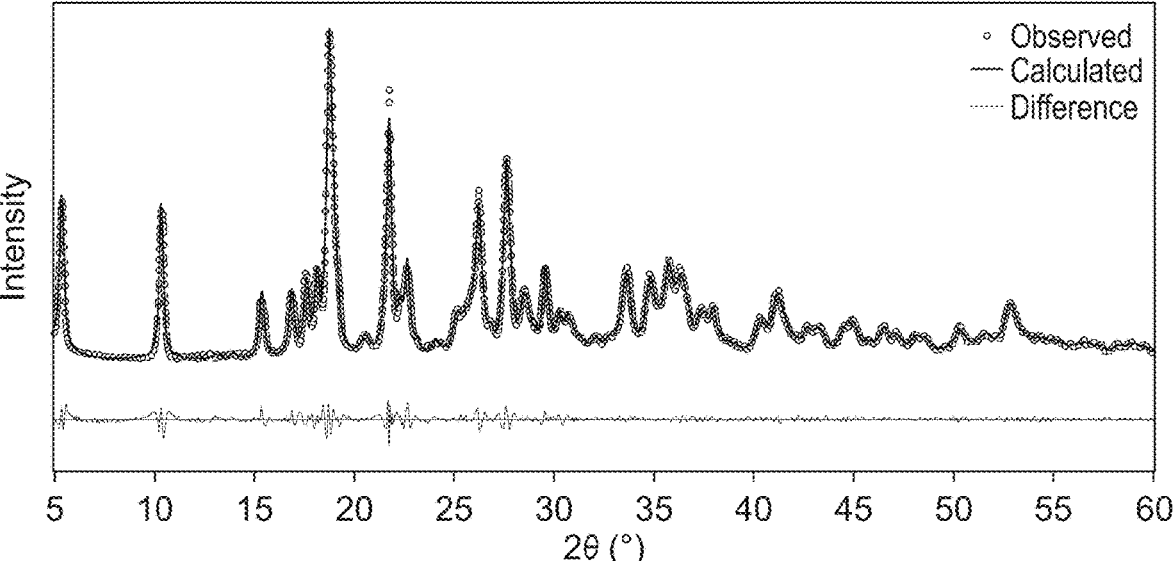
FIG. 15 graphically depicts a whole diffraction pattern profile fitting using the LeBail method for the powder X-ray diffraction pattern of the compound (RCOOH)$_2$CuCl$_4$. Radiation source is Cu-Kα.
Figure 16:
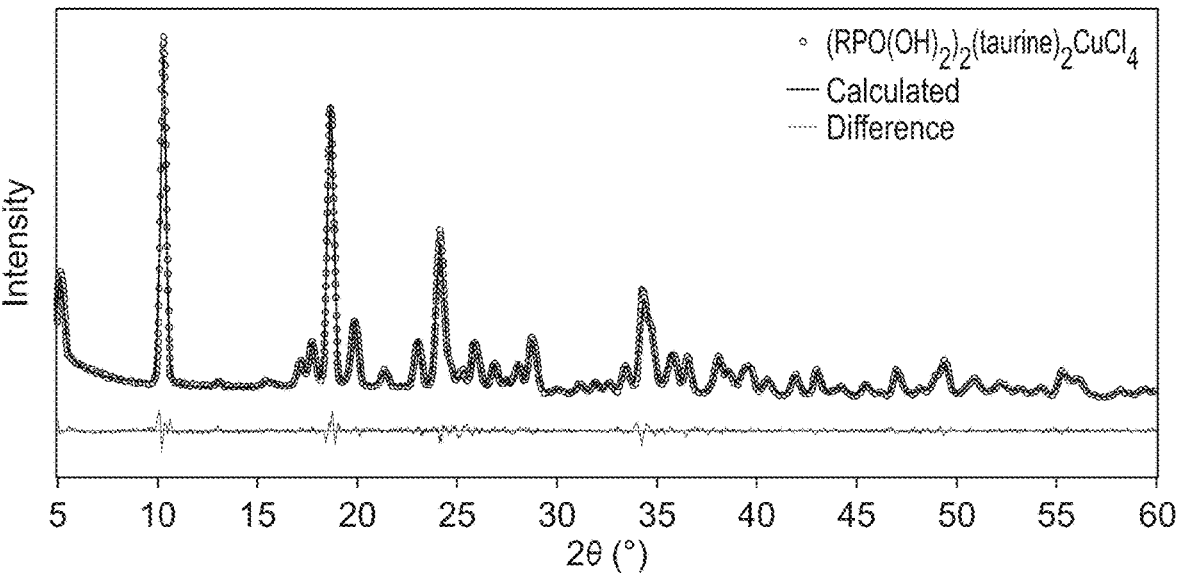
FIG. 16 graphically depicts a whole diffraction pattern profile fitting using the LeBail method for the powder X-ray diffraction pattern of the compound (RPO(OH)$_2$)$_2$CuCl$_4$. Radiation source is Cu-Kα.
Figure 17:
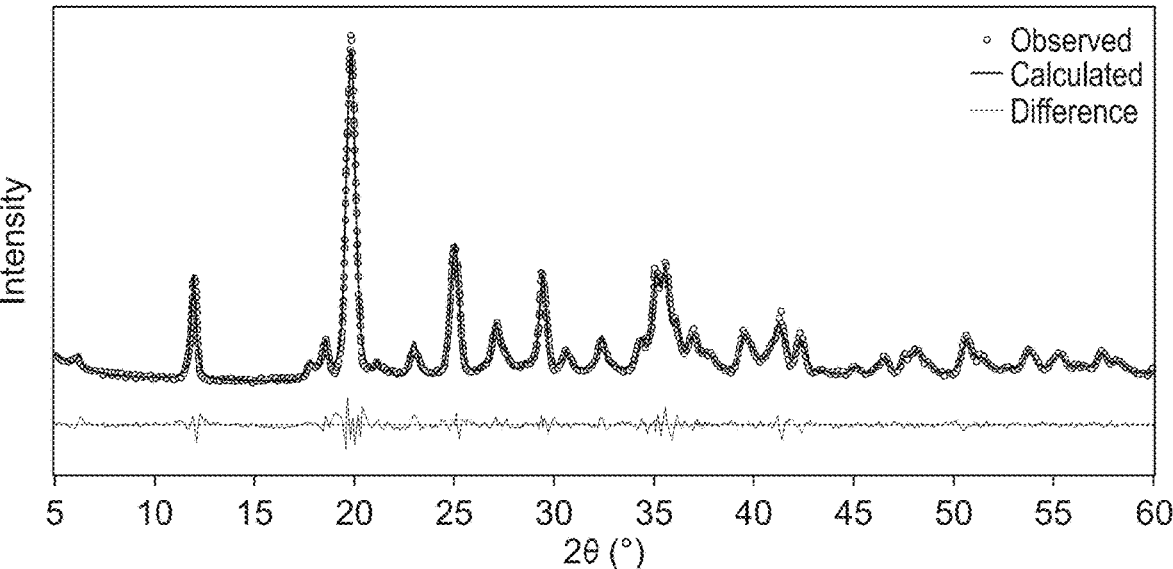
FIG. 17 graphically depicts a whole diffraction pattern profile fitting using the LeBail method for the powder X-ray diffraction pattern of the compound Li$_2$(taurine)$_2$CuCl$_4$. Radiation source is Cu-Kα.
Figure 18:
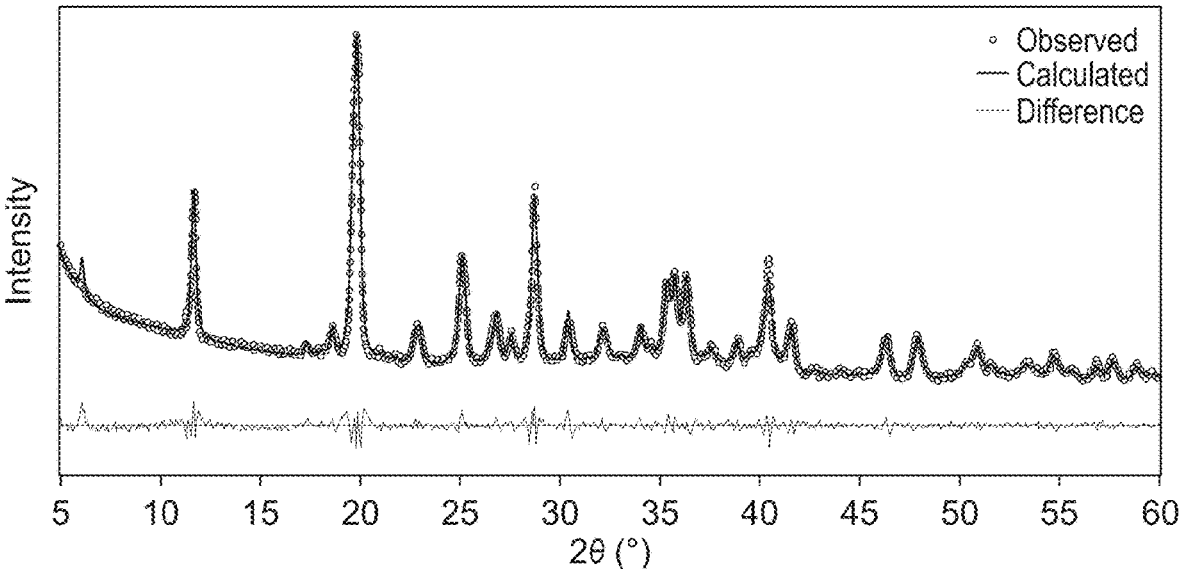
FIG. 18 graphically depicts a whole diffraction pattern profile fitting using the LeBail method for the powder X-ray diffraction pattern of the compound Li$_2$(taurine)$_2$MnCl$_4$. Radiation source is Cu-Kα.
Figure 19:
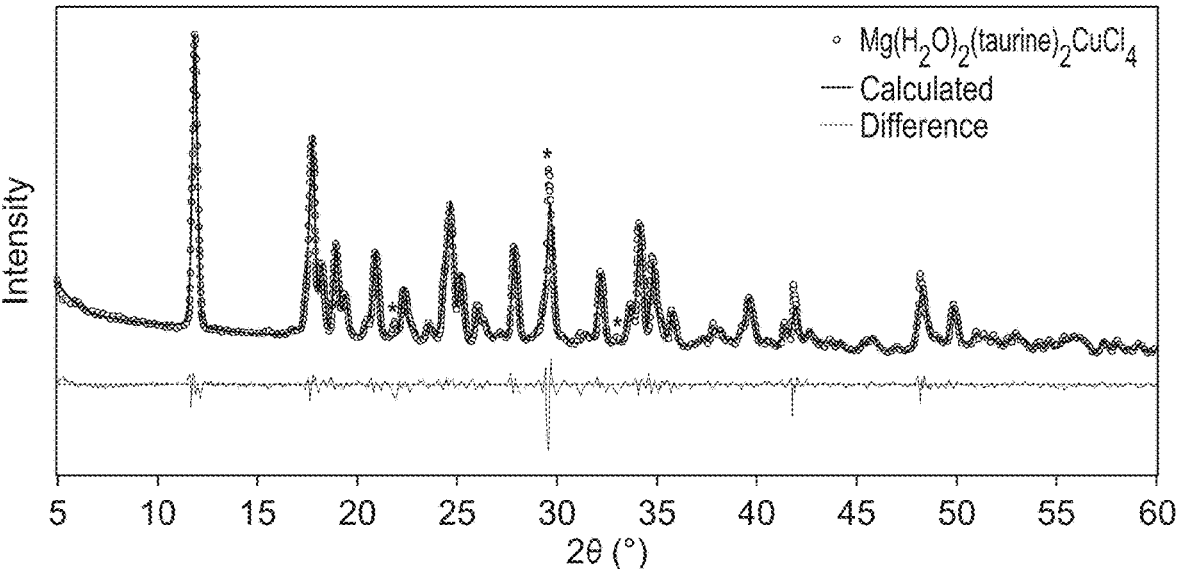
FIG. 19 graphically depicts a whole diffraction pattern profile fitting using the LeBail method for the powder X-ray diffraction pattern of the compound (Mg(H$_2$O)$_2$) (taurine)$_2$CuCl$_4$. The starred peaks are consistent with a MgCl$_2$ impurity. Radiation source is Cu-Kα.
Figure 20:
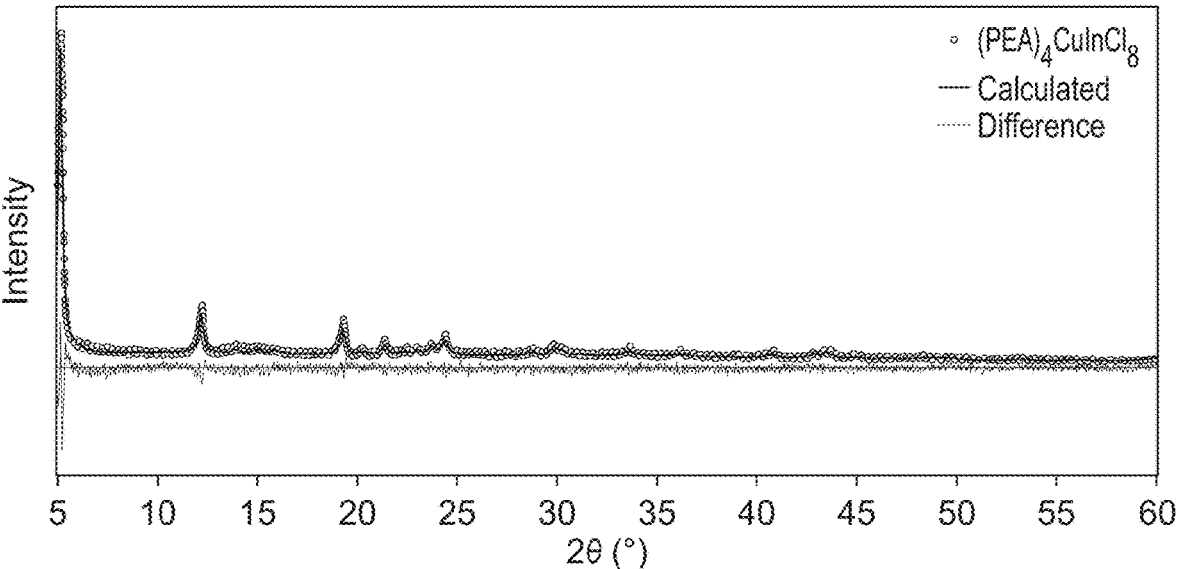
FIG. 20 graphically depicts a whole diffraction pattern profile fitting using the LeBail method for the powder X-ray diffraction pattern of the compound (PEA)$_4$CuInCl$_8$. Radiation source is Cu-Kα.
Figure 21:
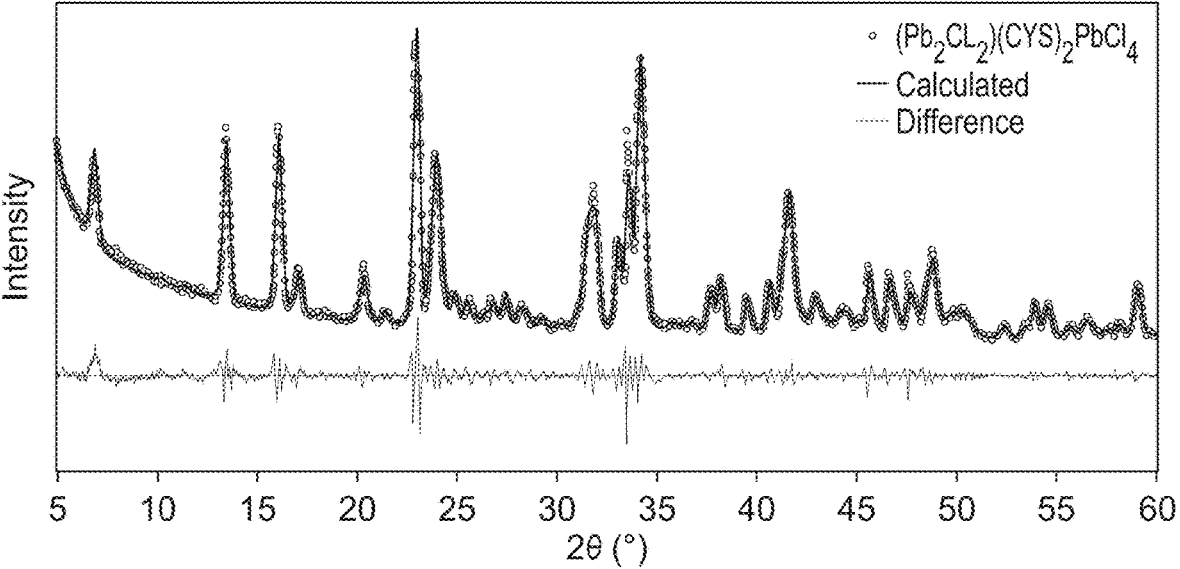
FIG. 21 graphically depicts a whole diffraction pattern profile fitting using the LeBail method for the powder X-ray diffraction pattern of the compound (Pb$_2$Cl$_2$)(CYS)$_2$PbCl$_4$. Peaks labeled with asterisks are tentatively assigned to a minor PbCl$_2$ impurity. Radiation source is Cu-Kα.
Figure 22:
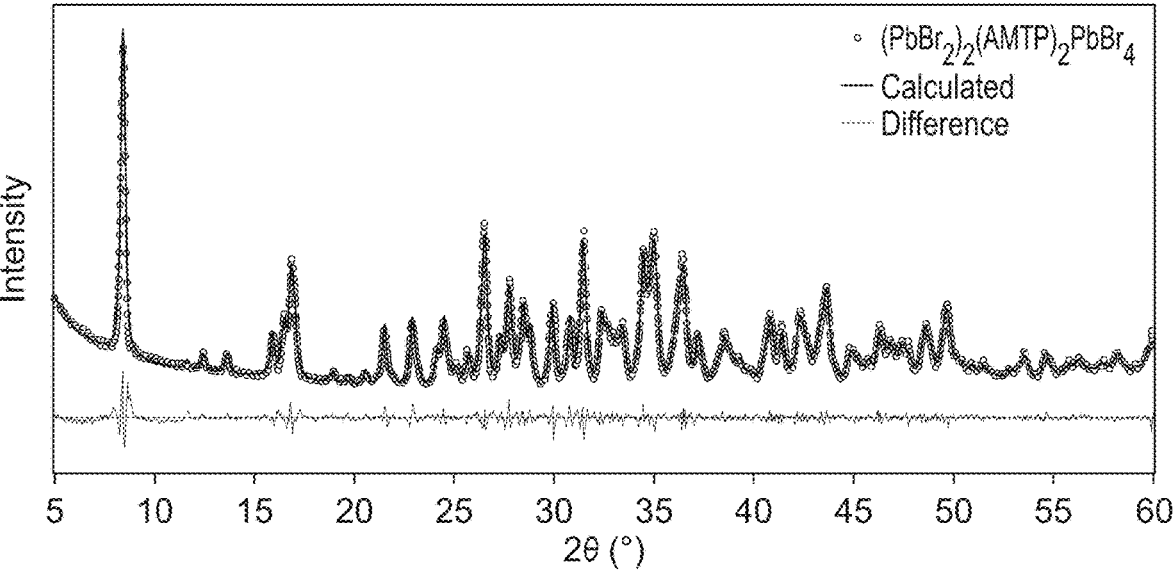
FIG. 22 graphically depicts a whole diffraction pattern profile fitting using the LeBail method for the powder X-ray diffraction pattern of the compound (PbBr$_2$)$_2$ (AMTP)$_2$PbBr$_4$. Radiation source is Cu-Kα.

Density functional theory (DFT) calculations were performed within the generalized gradient approximation in the Perdew-Burke-Ernzerhof parametrization (PBE), including spin-orbit coupling, as implemented in the Quantum Espresso package, and using the experimental lattice parameters determined in this work and relaxed atomic positions (see Simplified structure model of $(Pb_2Cl_2)(CYS)_2PbCl_4$ and FIG. 12), using a 1×3×3 k-point grid. $(Pb_2Cl_2)(CYS)_2PbCl_4$ includes 124 atoms and 544 electrons in the unit cell, while $(PbBr_2)_2(AMPT)_2PbBr_4$ includes 110 atoms and 392 electrons in the unit cell. For all elements we used norm-conserving pseudopotentials as available on the Pseudo-Dojo library, and a plane wave cutoff of 50 Ry. For both structures we calculate the total energy and charge density using a Γ-centered k-point grid of 1×3×3.

We calculate the quasiparticle corrections to the DFT Kohn-Sham eigenvalues of both structures within the single-shot $G_0W_0$ approximation, including spin-orbit coupling, as implemented in the BerkeleyGW code. For both structures we calculate the dielectric function (and self-energy) using a half-shifted (Γ-centered) 1×4×4 k-grid, and 400 empty states, amounting to a total of 944 and 792 bands for $(Pb_2Cl_2)(CYS)_2PbCl_4$, and $(PbBr_2)_2(AMPT)_2PbBr_4$, respectively. Based on convergence tests performed on model Ruddlesden-Popper perovskites, we expect this computational setup to yield band gaps that are underestimated with respect to the converged quasiparticle band gap by at least 0.2 eV, a compromise we make to reduce the significant computational effort for GW+BSE calculations on these large systems. We find direct quasiparticle band gaps at the Γ-point of 3.3 eV and 2.9 eV for $(Pb_2Cl_2)(CYS)_2PbCl_4$, and $(PbBr_2)_2(AMPT)_2PbBr_4$, respectively, both values underestimated with respect to the optical absorption onsets observed from experiment.

We calculate the optical absorption spectrum building on our single shot GW calculations via the Bethe-Salpeter equation approach, also using the BerkeleyGW code. In our BSE calculations, we calculate the electron-hole kernel on a 1×4×4 coarse k-point grid using 46 and 24 conduction and valence band states for $(Pb_2Cl_2)(CYS)_2PbCl_4$, and $(PbBr_2)_2(AMPT)_2PbBr_4$, respectively. We interpolate the quasiparticle eigenvalues and electron-hole kernel onto a Γ-centered fine grid of 1×10×10 and 1×20×20 for $(Pb_2Cl_2)(CYS)_2PbCl_4$, and $(PbBr_2)_2(AMPT)PbBr_4$, respectively and including 44 conduction and valence states and 20 conduction and valence states for $(Pb_2Cl_2)(CYS)_2PbCl_4$, and $(PbBr_2)_2(AMPT)_2PbBr_4$, respectively. This computational setup yields a converged optical absorption spectrum in the energy range shown FIG. 3, and exciton binding energies with an error-bar of approximately 60 meV. We calculate exciton binding energies of 366 meV and 358 meV for $(Pb_2Cl_2)(CYS)_2PbCl_4$ and $(PbBr_2)_2(AMPT)_2PbBr_4$, respectively. Exciton conditional probability distributions depicted in FIGS. 3g-3h are calculated by summing up square moduli of the exciton wave functions' distributions calculated from GW+BSE with the hole fixed at different positions, as follows. For $(PbBr_2)_2(AMPT)_2PbBr_4$ we fix the hole on two different positions corresponding to neighboring apical and equatorial bromine of one of the two perovskite layers in the unit cell, and for $(Pb_2Cl_2)(CYS)_2PbCl_4$ we fixed the holes on the four different positions corresponding to sulfur ions in one of the two intergrowth layers of the unit cell. These choices were informed by the majority chemical composition of the valence band top at the Γ-point.

Synthesis of $(RCOOH)_2CuCl_4$ ($RCOOH^+$=4-(ammoniomethyl)benzoic acid)

The reagents $CuCl_2$ (19 mg, 0.14 mmol) and 4-(aminomethyl)benzoic acid (44 mg, 0.29 mmol) were added to a 4-mL glass vial and dissolved in 0.5 mL of 12-M HCl (aq). The solution was heated at 100° C. for 6 h then slowly cooled to room temperature to yield the crystalline product as large yellow plates. Elemental Analysis. Calculated: C, 37.70%, H 3.95%, N 5.49%. Found: C 37.91%, H 3.96%, N 5.70%.

Synthesis of $(RPO(OH)_2)_2CuCl_4$ ($RPO(OH)_2^+$=3 (ammoniopropyl)phosphonic acid)

The reagents $CuCl_2$ (19 mg, 0.14 mmol) and 3-(aminopropyl)phosphonic acid (40 mg, 0.29 mmol) were added to a 4-mL glass vial and dissolved in 0.1 mL of 6-M HCl (aq). The vial was heated to 100° C. for 6 h then slowly cooled to room temperature to yield the product as large yellow plate-shaped crystals. Elemental Analysis. Calculated: C, 14.84%, H 4.57%, N 5.77%. Found: C 14.97%, H 4.65%, N 5.83%.

Synthesis of $(H_3O)_2(taurine)_2CuCl_4$ (taurine= $+H_3N(CH_2)_2SO_3^-$)

Taurine (2-aminoethanesulfonic acid; 75 mg, 0.60 mmol) and anhydrous $CuCl_2$ (40 mg, 0.30 mmol) were dissolved in 0.3 mL of concentrated hydrochloric acid in a 4-mL vial. The mixture was heated to 100° C. (Caution: be aware of pressure build-up) until the solids dissolved and the vial was left to cool over the course of 2-3 h to yield brown plate-like crystals. The product was unstable outside of the mother liquor. Crystals selected for single-crystal diffraction were quickly immersed in N-Paratone oil and transferred to a cold $N_2$ stream to avoid decomposition.

Synthesis of $Li_2(taurine)_2CuCl_4$

Taurine (75 mg, 0.60 mmol) and anhydrous $CuCl_2$ (0.30 mmol) were added to 0.3 mL of a 10 M solution of aqueous LiCl in a 4-mL vial. The mixture was heated to 100° C. and stirred until the precursors were completely dissolved. Then, the vial was left to cool for 2-3 h and square yellow plate-like crystals were found to precipitate.

Synthesis of $Li_2(taurine)_2MnCl_4$

Taurine (75 mg, 0.60 mmol) and anhydrous $MnCl_2$ (76 mg, 0.60 mmol) were added to 0.45 mL of a 10 M solution of aqueous LiCl in a 4-mL vial. The mixture was heated to 100° C. until the precursors were completely dissolved. Then, the vial was left to cool for 2-3 h and square yellow plate-like crystals were found to precipitate.

Synthesis of $(Mg(H_2O)_2)(taurine)_2CuCl_4$

A 4-mL glass scintillation vial was charged with taurine (0.60 mmol, 75 mg) and $CuCl_2$ (0.30 mmol, 40. mg) and 600 µL of 5-M $MgCl_2$ (aq). The vial was sealed and heated to 100° C. in a gravity convection oven for 24 h and slowly cooled to room temperature. After three to four days of standing at room temperature, plank shaped crystals of the target compound were formed among powder of the target compound.

Synthesis of $(PEA)_4CuInCl_8$ ($PEA^+$=phenethylammonium)

Crystals and powders of $(PEA)_4CuInCl_8$ were obtained by combining stoichiometric quantities of CuCl (17 mg, 0.17 mmol) and $In_2O_3$ (24 mg, 0.086 mmol) with eight equivalents of phenethylamine (180 µL, 1.4 mmol) in 1 mL of 6-M HCl(aq) under a nitrogen atmosphere. A small amount of $H_3PO_2$ (60 µL, 50 wt. % solution in $H_2O$) was added to the solution to reduce any trace amount of $Cu^{II}$. Upon heating to 100° C., the solids dissolved yielding a light-yellow solution. Quickly cooling the solution while stirring yielded a colorless powder that was collected by filtration, washed with diethyl ether, and dried under reduced pressure for 20 h. Alternatively, slowly cooling the solution at a controlled rate of 4° C./h yielded colorless plate-like crystals suitable for single-crystal X-ray diffraction.

Synthesis of $(CuCl_2)_4(HIS)_4CuInCl_8$ ($HIS^{2+}$=histammonium)

Crystals of $(CuCl_2)_4(HIS)_4CuInCl_8$ suitable for single crystal X-ray diffraction were prepared by combining CuCl (11 mg, 0.11 mmol), $In_2O_3$ (16 mg, 0.057 mmol), histamine (53 mg, 0.48 mmol), and $H_3PO_2$ (35 µL, 50 wt. % solution in $H_2O$) in 0.4 mL of 12-M HCl (aq). The mixture was heated and stirred briefly at 100° C. in a loosely capped vial until all solids dissolved, forming a pale-yellow solution, and then cooled to room temperature. The solution was purged with $N_2$ for 40 minutes, causing a colorless powder to precipitate. This solid was re-dissolved at 100° C. and then the vial was removed from the heat and allowed to cool. The solution sat at room temperature for four days after which time colorless crystals formed. These crystals were re-dissolved at 100° C. and the solution was slowly cooled to room temperature at a controlled rate of 3° C./h, forming large chunks of colorless crystalline solid. The solution sat undisturbed at room temperature for six days and was then re-heated to 100° C. to dissolve the previously formed crystals. Additional $H_3PO_2$ (25 µL, 50 wt. % solution in $H_2O$) was added and the solution was purged with $N_2$ for 1 h at room temperature and then for 15 minutes while heating at 100° C. The solution was slowly cooled to room temperature at 2° C./h and then allowed to sit undisturbed for four days, resulting in formation of clusters of small colorless blade-like crystals. Note that attempts to synthesize this perovskite following a procedure similar to that outlined above but without the multi-day period between combining the precursors in HCl and the final controlled slow cool yielded crystals of a different phase.

Synthesis of $(PbBr_2)_2(AMTP)_2PbBr_4$ ($AMTP^+$=4-(ammoniomethyl)-tetrahydropyran)

In a 20-mL glass scintillation vial, $PbBr_2$ (1.0771 g, 2.935 mmol) was dissolved in 3.0 mL of 12-M HBr (aq), and 0.236 mL (2.01 mmol) of 4-aminomethyl-tetrahydropyran was added dropwise. The resulting mixture was dissolved with mild sonication. The solution was transferred to a Teflon-capped vapor diffusion chamber with 20 mL of diethyl ether as the antisolvent. The chamber was sealed and left to stand in the dark. After several days, the large colorless plates that formed were isolated by vacuum filtration, washed with diethyl ether and dried under reduced pressure. Elemental analysis. Calculated: C, 9.65%, H 1.89%, N 1.87%. Found: C 9.76%, H 1.88%, N 2.05%.

Figure 23:
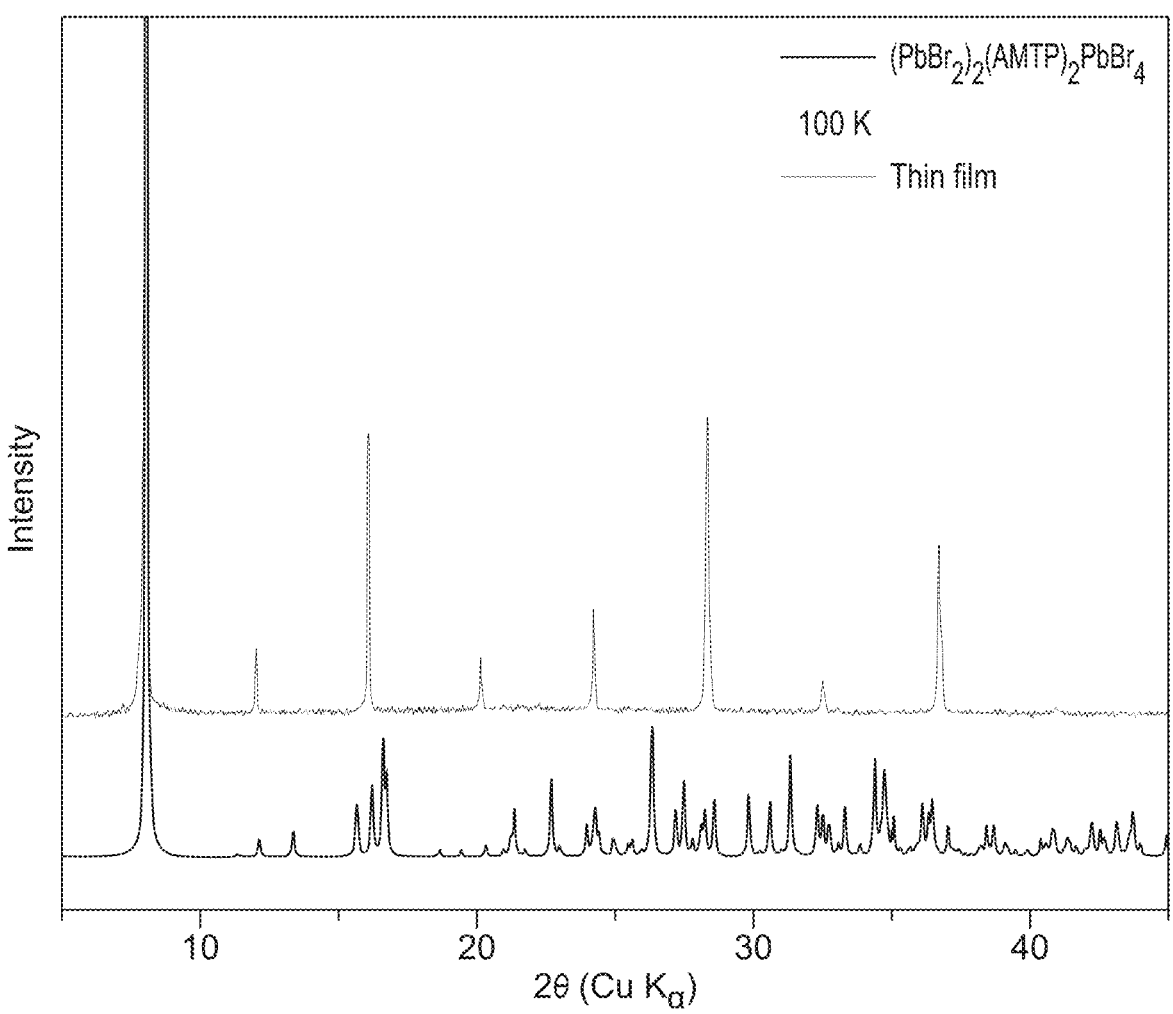
FIG. 23 graphically depicts a room temperature powder X-ray diffraction pattern of a (PbBr$_2$)$_2$(AMTP)$_2$PbBr$_4$ oriented film on quartz compared to the simulated powder pattern of the structure. Radiation source is Cu-Ka.

Thin films of $(PbBr_2)_2(AMTP)_2PbBr_4$ were prepared by spin casting in a nitrogen-filled glovebox. A circular quartz plate was cleaned by sequential sonications in an aqueous detergent solution, isopropanol, and deionized water. The plate was dried using compressed air and cleaned by UV-ozone. In a nitrogen-filled glovebox, 51.6 mg of the compound were dissolved in 1 ml of DMSO and passed through 0.22 µm PTFE filter. The solution was dropcast onto the substrate mounted in a spin coater then spun at 4000 rpm (4000 rpm/s acceleration) for 60 s under a nitrogen flow. The coated quartz plate was then heated to 100° C. for 1 minute. Powder X-ray diffraction (FIG. 23) is consistent with the phase pure recrystallization of $(PbBr_2)_2(AMTP)_2PbBr_4$.

Synthesis of $(Pb_2Cl_2)(CYS)_2PbCl_4$ ($CYS=^+H_3N(CH_2)_2S^-$)

Aminoethanethiol hydrochloride (140 mg, 12 mmol) and lead (II) acetate trihydrate (230 mg, 6.2 mmol) and lead (II) chloride (170 mg, 6.2 mmol) were added to 30 mL of 6-M aqueous NaCl to form a yellow powder, which upon further stirring turned colorless. The suspension was heated to 100° C. for 10 minutes to afford solid $(Pb_2Cl_2)(CYS)_2PbCl_4$. Single crystals of the target compound may be obtained in low yield by hot-filtration of the product suspension followed by slow-cooling over the course of 12 h. Elemental analysis. Calculated: C, 4.86%, H 1.43%, N 2.83%, S 6.49%. Found: C 4.66%, H 1.33%, N 2.62%, S 6.29%.

It should be understood that the invention is not limited to the embodiments illustrated and described herein. Rather, the appended claims should be construed broadly to include other variants and embodiments of the invention, which may be made by those skilled in the art without departing from the scope and range of equivalents of the invention. It is indeed intended that the scope of the invention should be determined by proper interpretation and construction of the appended claims and their legal equivalents, as understood by those of skill in the art relying upon the disclosure in this specification and the attached drawings.

What is claimed is:

1. A method for self-assembling a layered heterostructure, the method comprising:

providing at least one first inorganic material;

providing a second inorganic material, which is the same or different from the first inorganic material;

providing an organic molecule containing first and second different functional groups, wherein the first functional group is at a first end of the molecule and operates to template a first type of two-dimensionally extended inorganic layers, and wherein the second functional group is at a second end of the molecule and operates to template a second type of extended inorganic layers comprising either one-dimensionally extended inorganic layers or two-dimensionally extended inorganic layers; and combining in a solution the at least one first inorganic material, the second inorganic material, and the organic molecule containing the first and second different functional groups;

wherein the layered heterostructure self-assembles in the solution; and wherein the organic molecule containing the first and second different functional groups directs the formation of the layered heterostructure in the solution, the first functional group of the organic molecule templating the first type of two-dimensionally extended inorganic layers of the heterostructure and the second functional group of the organic molecule templating the second type of extended inorganic layers comprising one-dimensionally extended inorganic layers of the heterostructure or two-dimensionally extended inorganic layers of the heterostructure, which are different in composition and/or connectivity from the first type of two-dimensionally extended inorganic layers of the heterostructure; and wherein the first type of two-dimensionally extended inorganic layers of the layered heterostructure comprise perovskite or double perovskite layers and the second type of one-dimensionally or two-dimensionally extended inorganic layers of the layered heterostructure comprise non-perovskite layers.

2. The method of claim 1, wherein the solution comprises an aqueous solution or an organic solution.

3. The method of claim 1, further comprising depositing a thin film of the layered heterostructure from the solution.

4. The method of claim 1, wherein the layered heterostructure crystallizes in the solution.

5. The method of claim 1, wherein the second one-dimensionally or two-dimensionally extended inorganic layers of the layered heterostructure form between the first one-dimensionally or two-dimensionally extended inorganic layers of the heterostructure, wherein the first and second inorganic layers are or are not in direct contact with each other.

6. The method of claim 1, wherein the perovskite or double perovskite layers each comprises a metal having an oxidation state of 1+, 2+, 3+, 4+, or 5+.

7. The method of claim 1, wherein the perovskite or double perovskite layers each comprises Ag, Au, Tl, Cu, In, Pb, Sn, Cu, Cr, Mn, Fe, Ru, Sb, In, Tl, Mo, Sn, or Sb.

8. The method of claim 1, wherein the perovskite or double perovskite layers each comprises F, Cl, Br or I.

9. The method of claim 1, wherein the perovskite or double perovskite layers are flat or corrugated.

10. The method of claim 1, wherein the organic molecule comprises organoammonium.

11. The method of claim 10, wherein the organoammonium comprises 2-aminoethanesulfonic acid, histammonium, zwitterionic cysteamine, or 4-ammoniomethyl-tetrahydropyran.

12. The method of claim 1, wherein the first and second functional groups are cationic, neutral, or anionic.

13. The method of claim 1, wherein the layered heterostructure is operative as a microelectronic or photovoltaic device.

14. The method of claim 1, wherein the non-perovskite layers are two-dimensionally extended.

15. The method of claim 1, wherein the non-perovskite layers are one-dimensionally extended.

* * * * *